(12) United States Patent
Nagata et al.

(10) Patent No.: US 9,716,152 B2
(45) Date of Patent: Jul. 25, 2017

(54) SEMICONDUCTOR DEVICE WITH ELECTRIC FIELD RELAXATION PORTION IN INSULATING LAYER BETWEEN LOWER AND UPPER TRENCH ELECTRODES

(71) Applicants: ROHM CO., LTD., Kyoto (JP); MaxPower Semiconductor, Inc., San Jose, CA (US)

(72) Inventors: Masaki Nagata, Kyoto (JP); Shigenari Okada, Kyoto (JP); Mohamed Darwish, San Jose, CA (US); Jun Zeng, San Jose, CA (US); Peter Su, San Jose, CA (US)

(73) Assignees: ROHM CO., LTD., Kyoto (JP); MAXPOWER SEMICONDUCTOR, INC., San Jose, CA (US)

( * ) Notice: Subject to any disclaimer, the term of this patent is extended or adjusted under 35 U.S.C. 154(b) by 0 days.

(21) Appl. No.: 15/245,172

(22) Filed: Aug. 23, 2016

(65) Prior Publication Data
US 2017/0062574 A1    Mar. 2, 2017

(30) Foreign Application Priority Data
Aug. 24, 2015  (JP) ................................. 2015-165187

(51) Int. Cl.
| H01L 29/40 | (2006.01) |
| H01L 29/78 | (2006.01) |
| H01L 29/66 | (2006.01) |

(52) U.S. Cl.
CPC .......... H01L 29/407 (2013.01); H01L 29/408 (2013.01); H01L 29/66734 (2013.01); H01L 29/7813 (2013.01)

(58) Field of Classification Search
None
See application file for complete search history.

(56) References Cited

U.S. PATENT DOCUMENTS

| 7,679,136 | B2 | 3/2010 | Kachi et al. |
| 8,466,513 | B2 * | 6/2013 | Grivna ................ H01L 29/7842 257/329 |
| 9,269,779 | B2 * | 2/2016 | Deng .................... H01L 29/063 |
| 2006/0157779 | A1 | 7/2006 | Kachi et al. |
| 2013/0153995 | A1 | 6/2013 | Misawa et al. |

FOREIGN PATENT DOCUMENTS

JP   2006-202931 A   8/2006

* cited by examiner

*Primary Examiner* — Thanh V Pham
(74) *Attorney, Agent, or Firm* — Rabin & Berdo, P.C.

(57) ABSTRACT

A semiconductor device according to the present invention includes a semiconductor layer having a trench, a first insulating film formed along an inner surface of the trench, and an upper electrode and a lower electrode embedded in the trench via the first insulating film and disposed above and below a second insulating film. An electric field relaxation portion that relaxes an electric field arising between the upper electrode and the semiconductor layer is provided between a side surface of the trench and a lower end portion of the upper electrode.

17 Claims, 19 Drawing Sheets

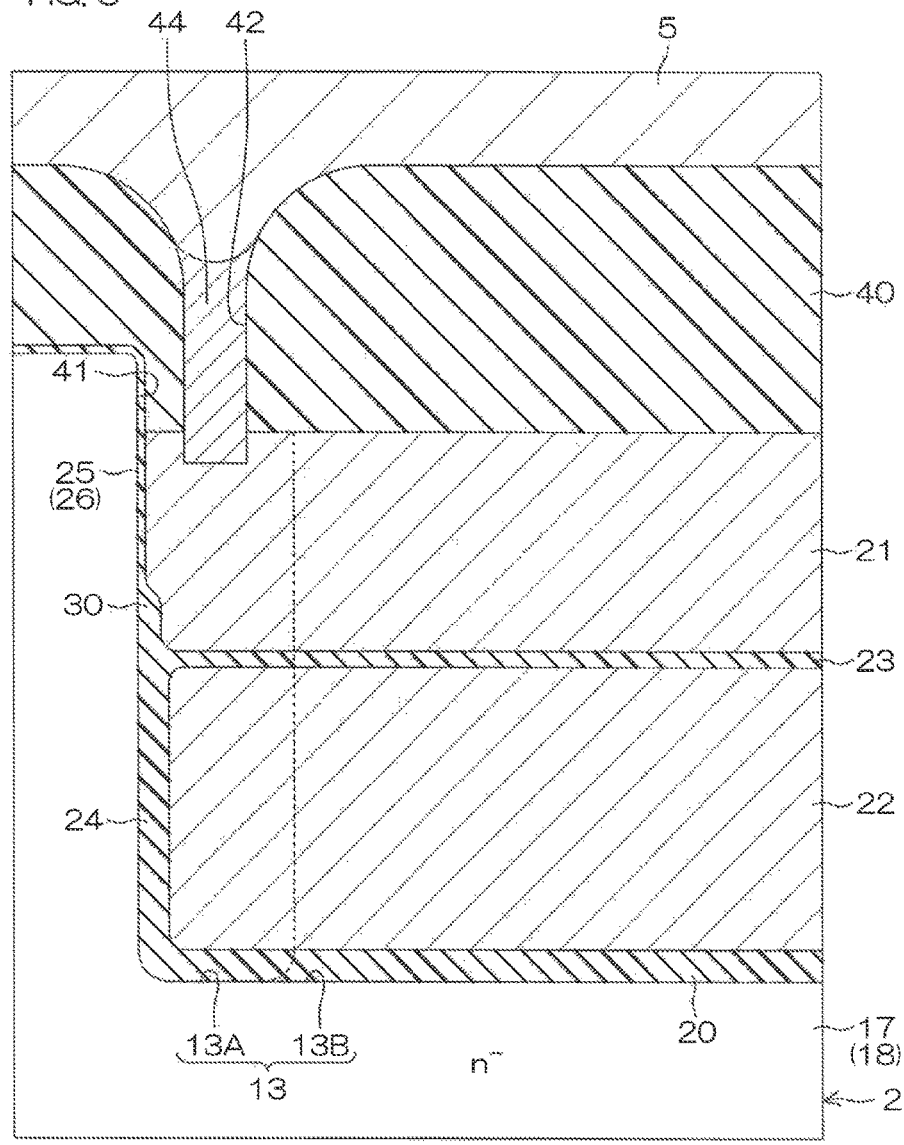

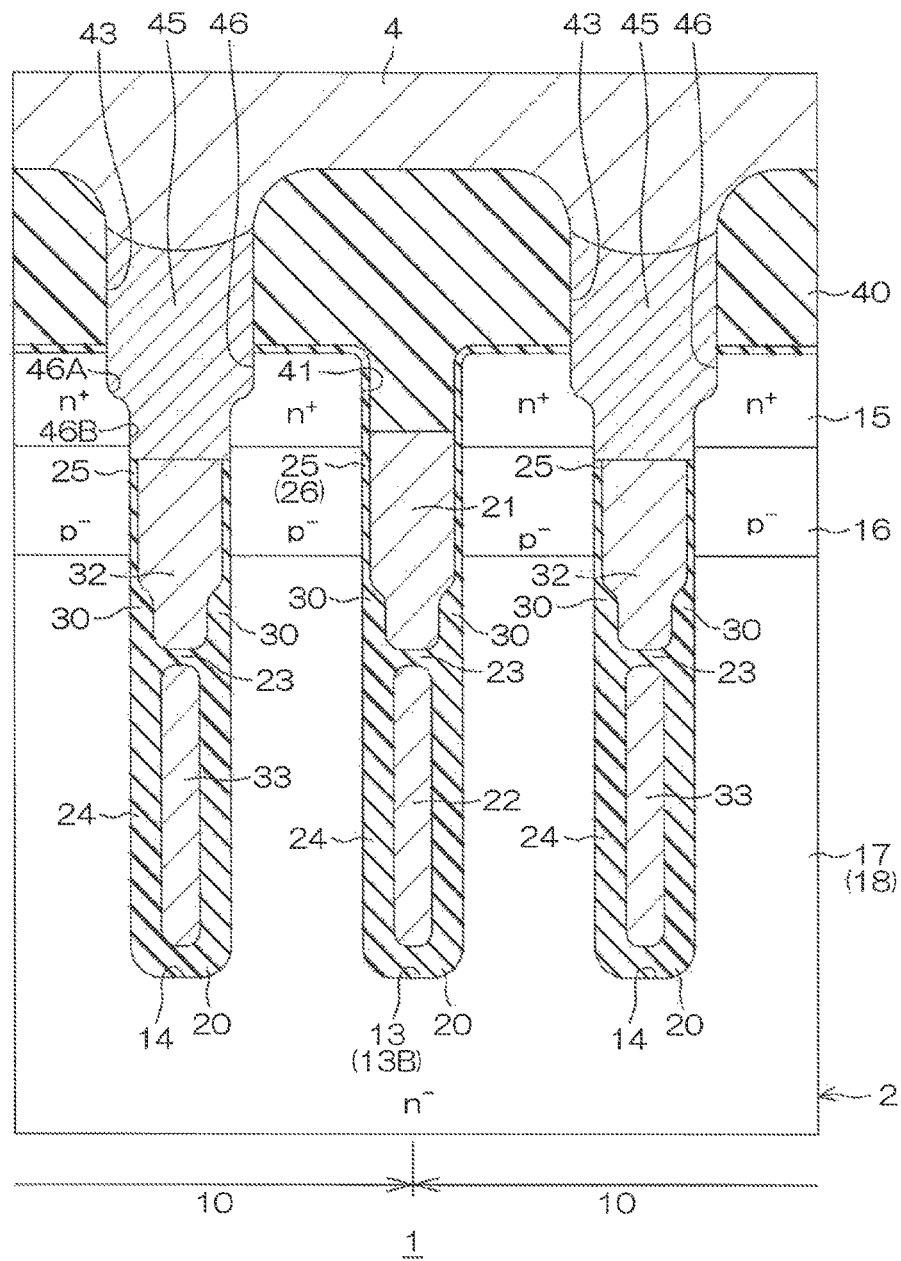

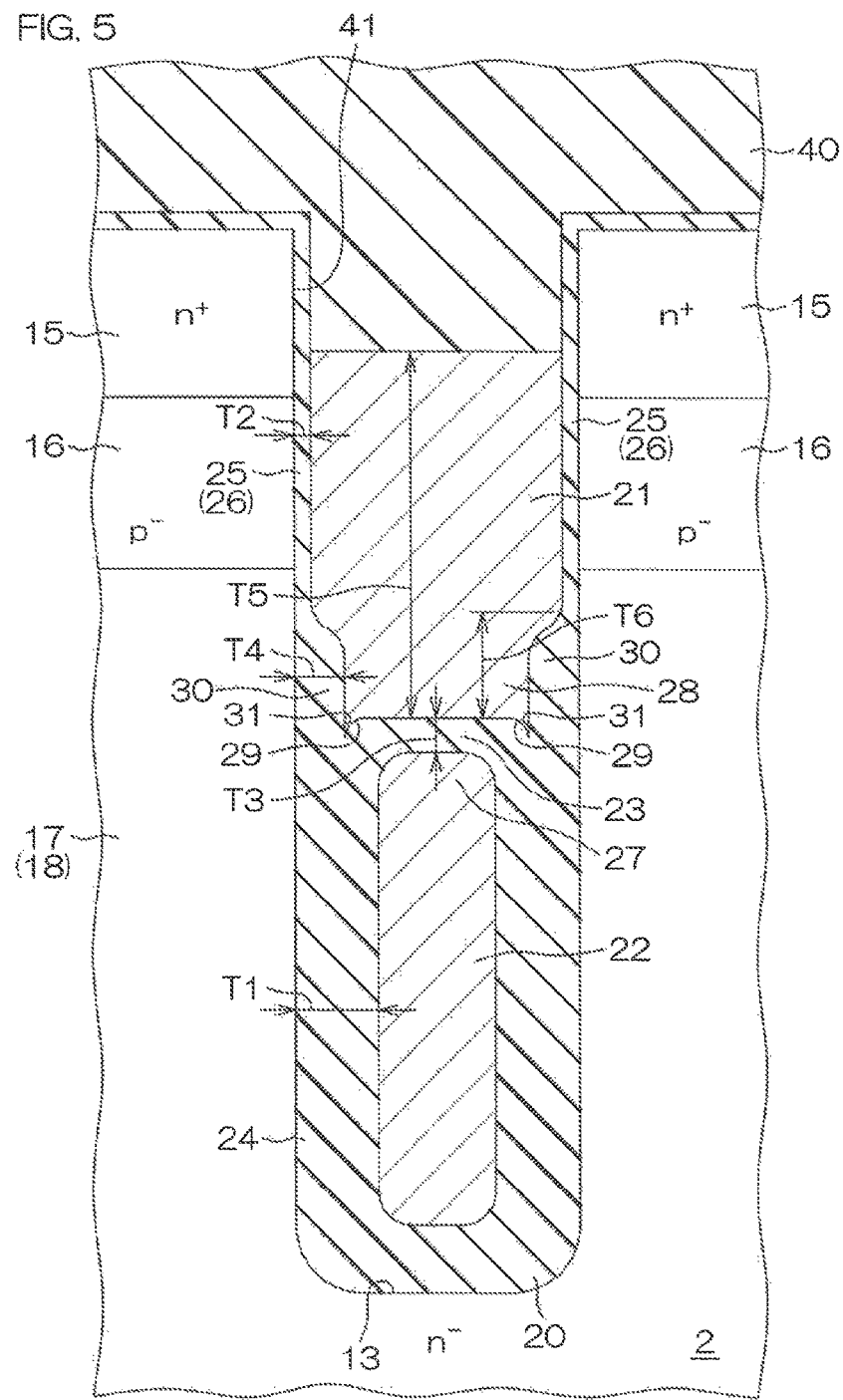

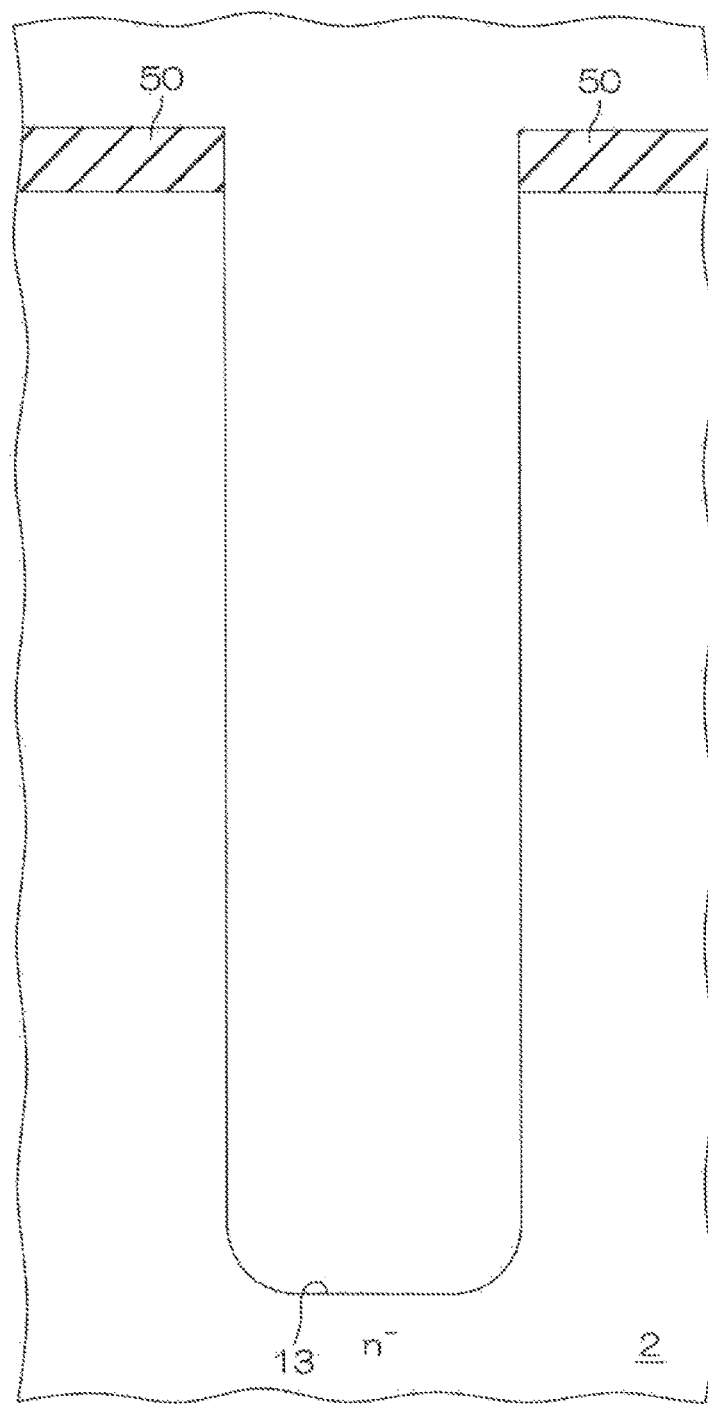

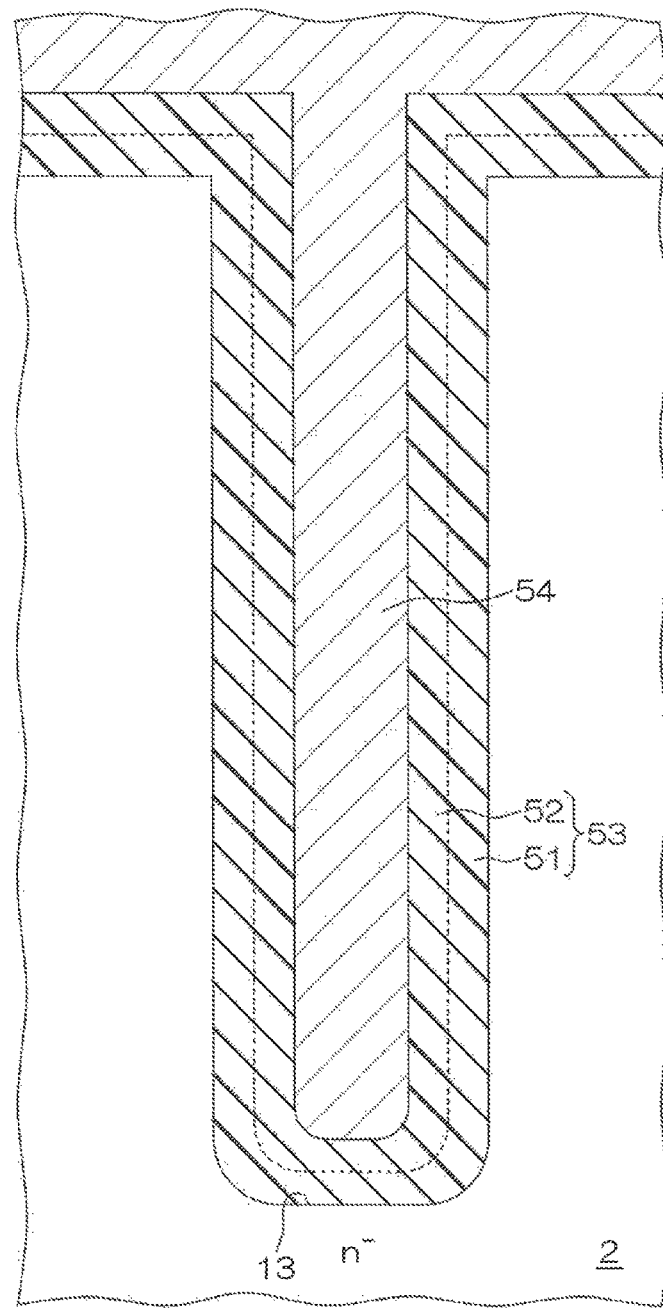

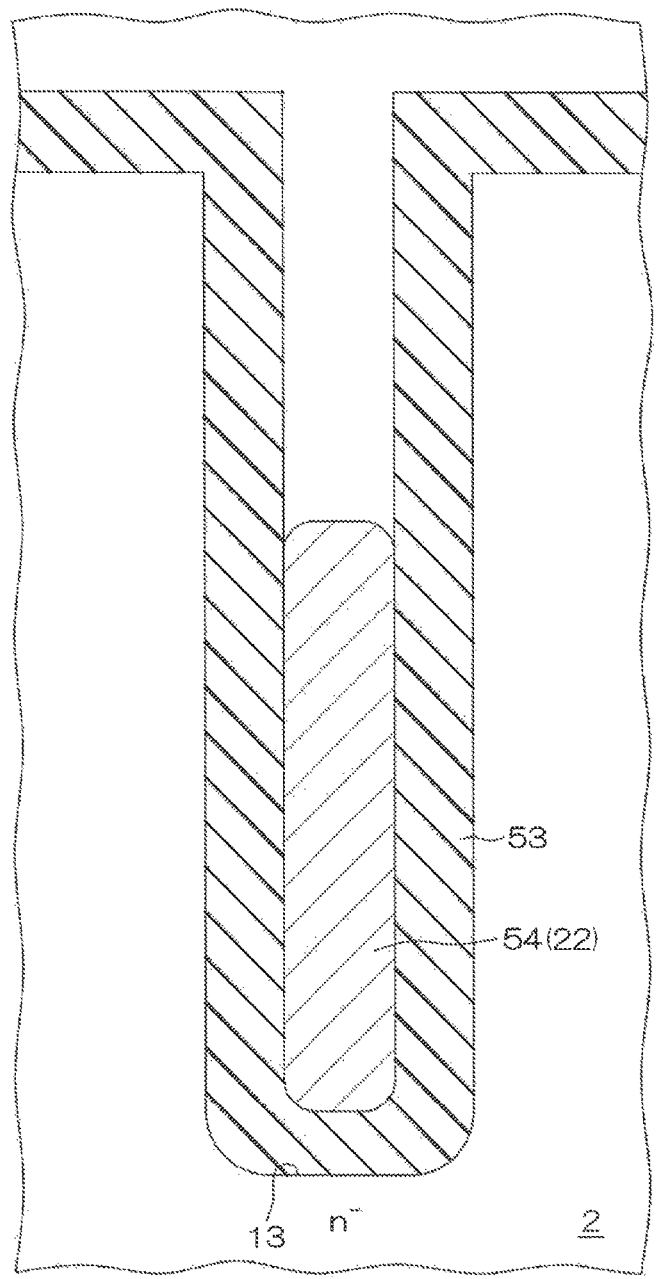

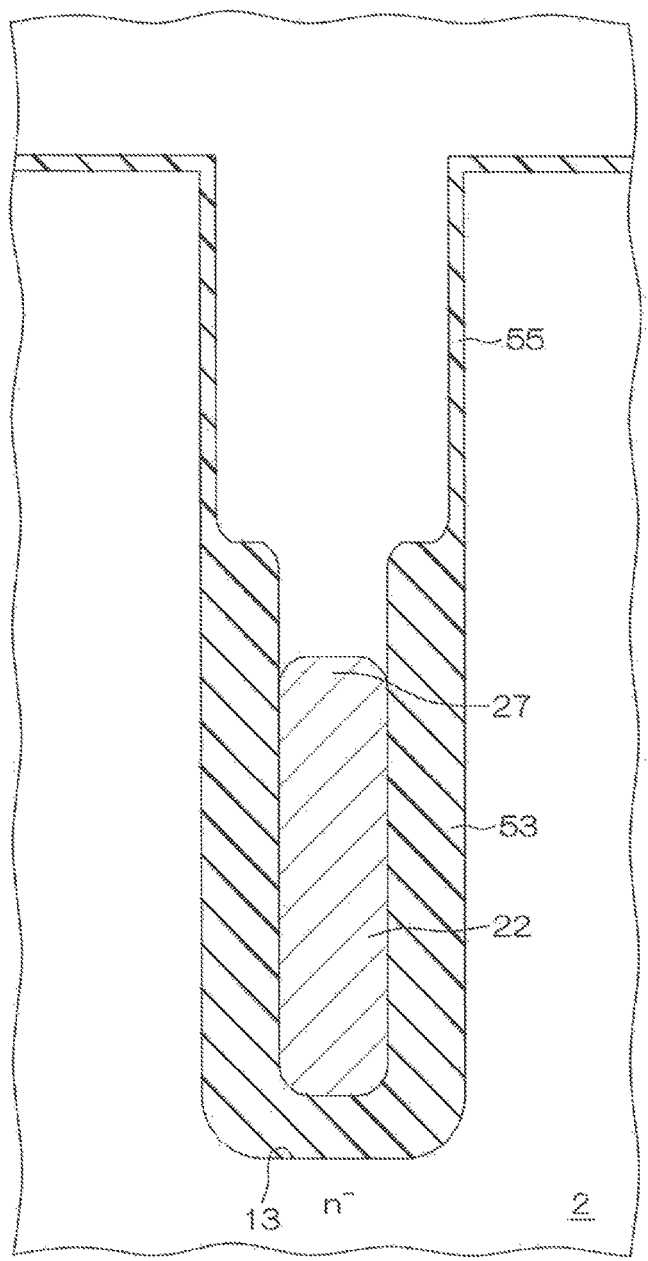

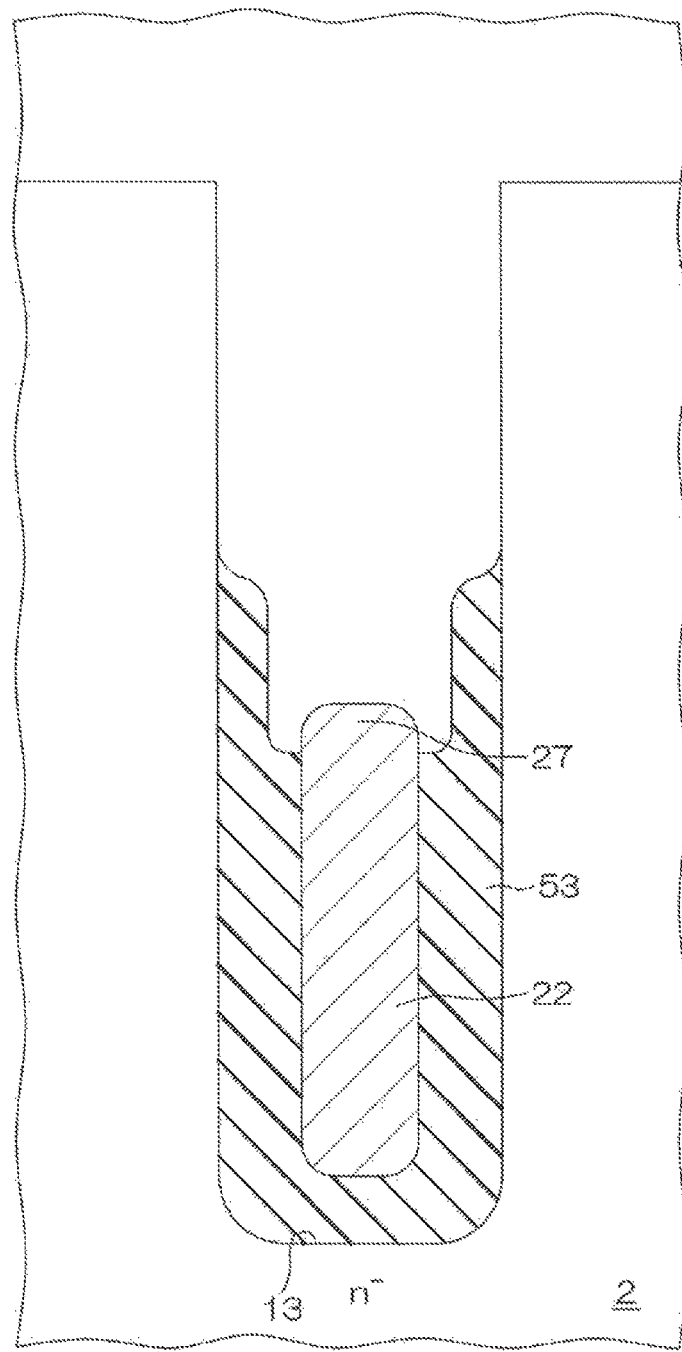

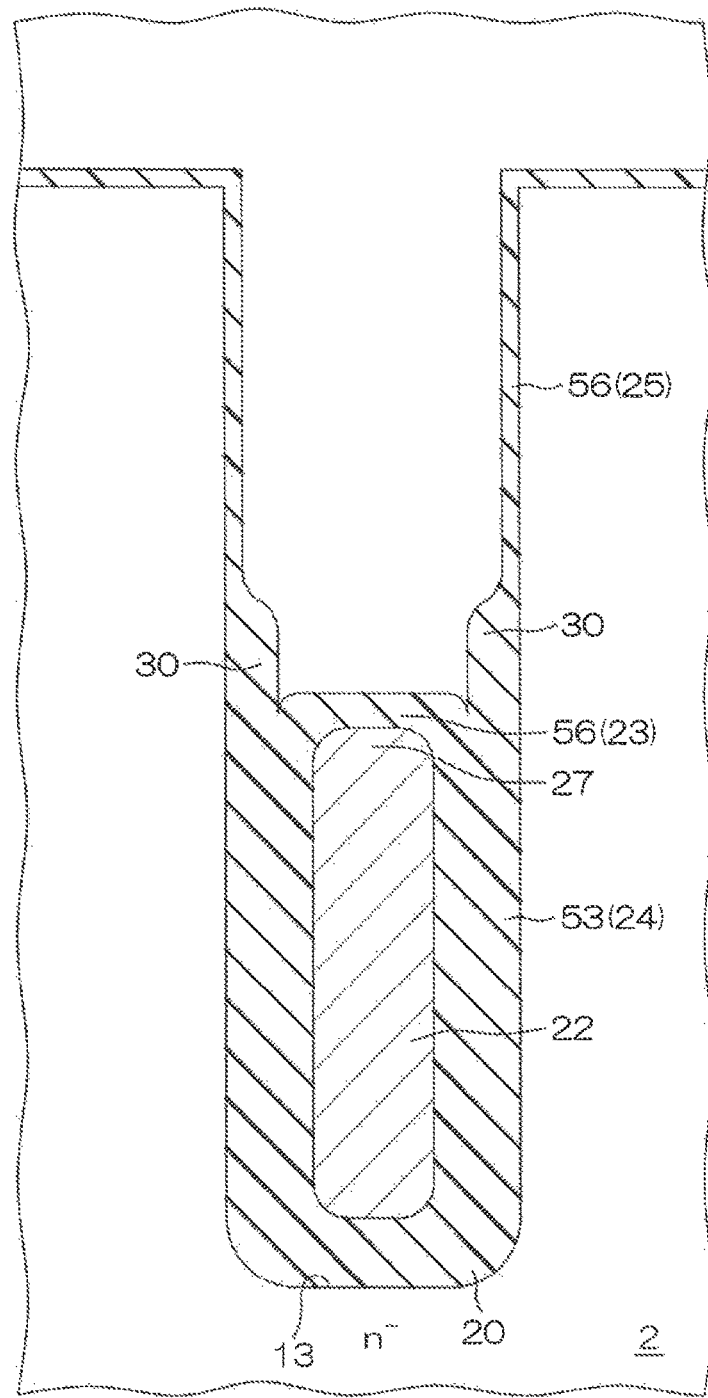

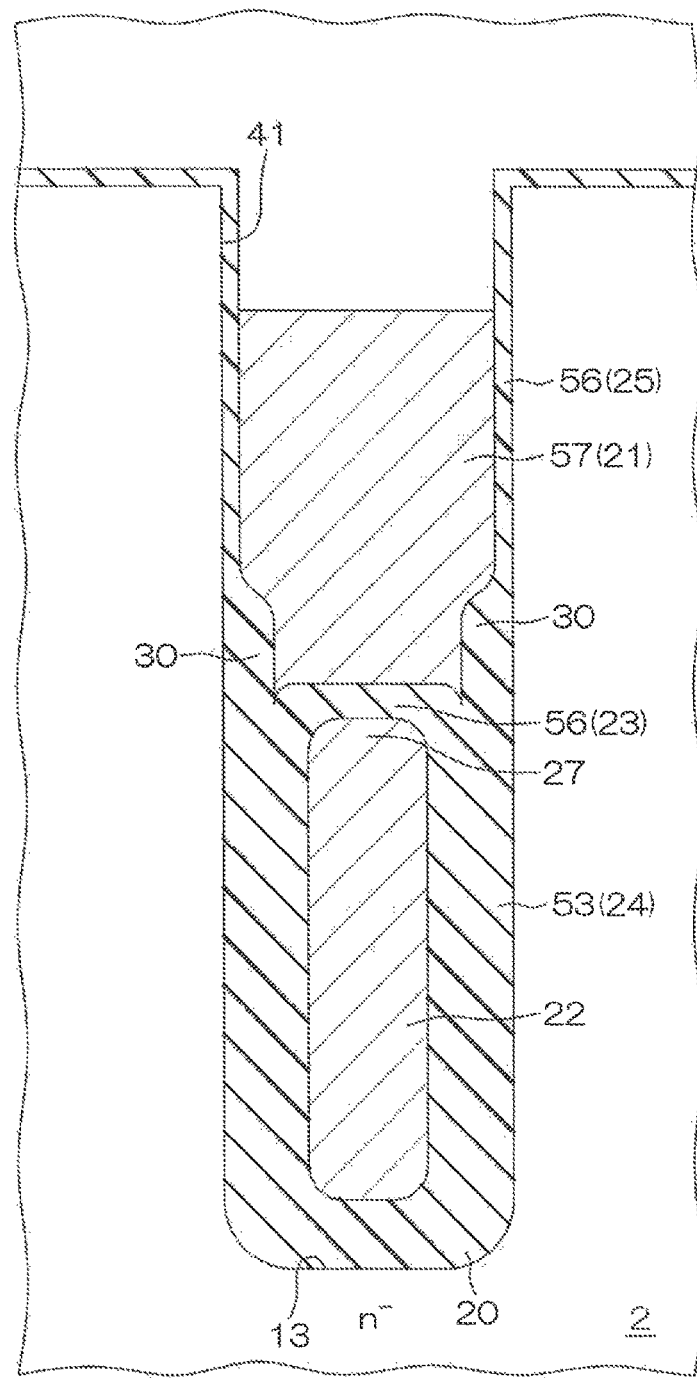

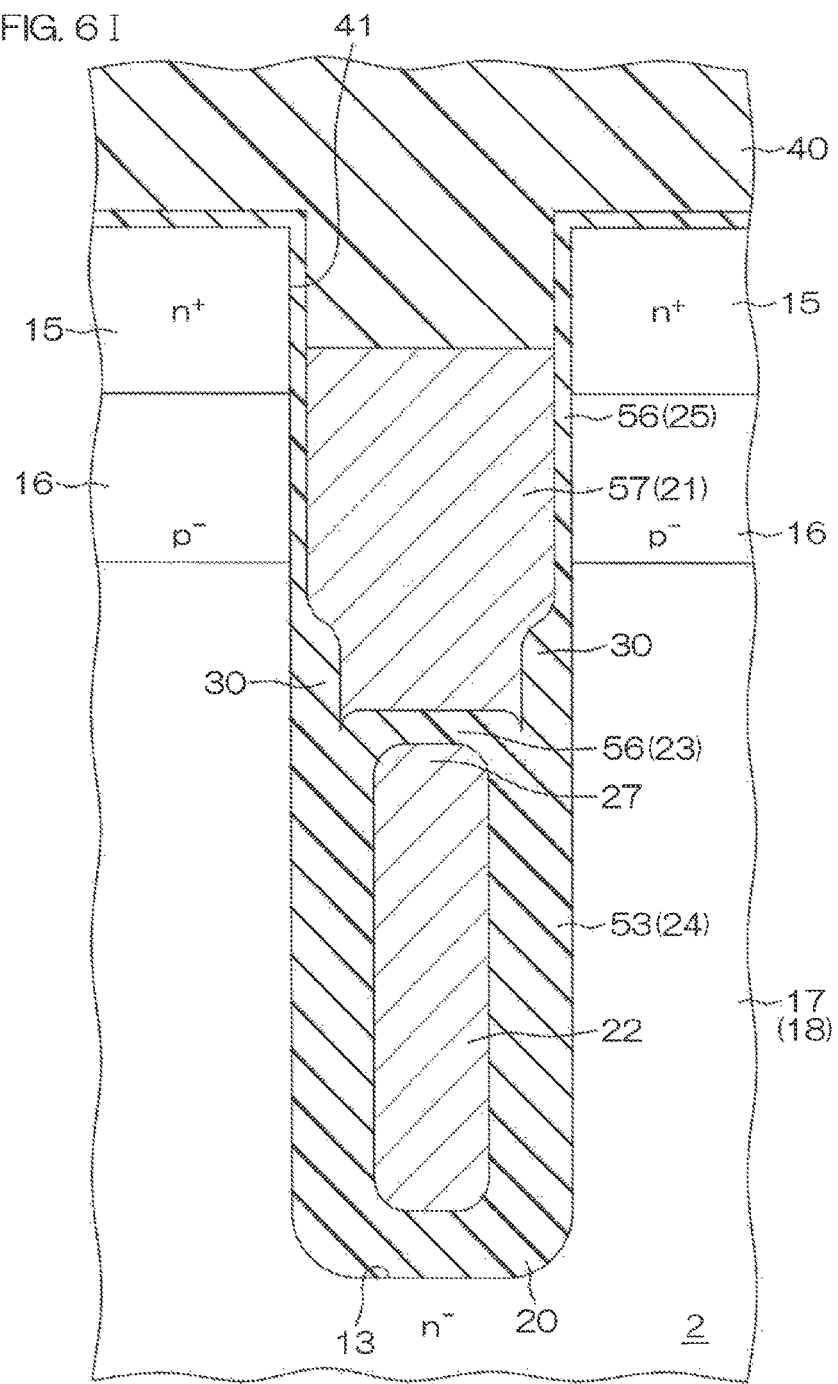

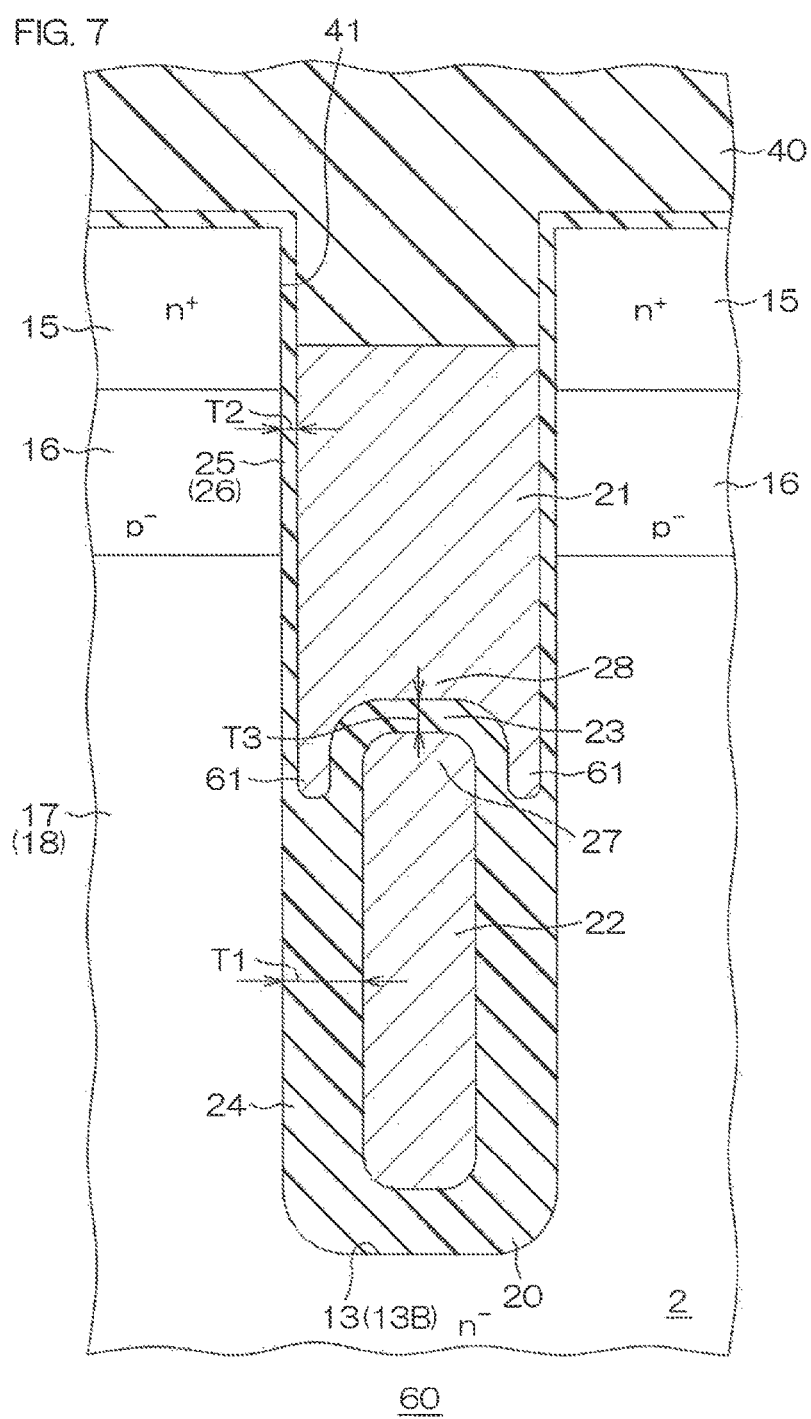

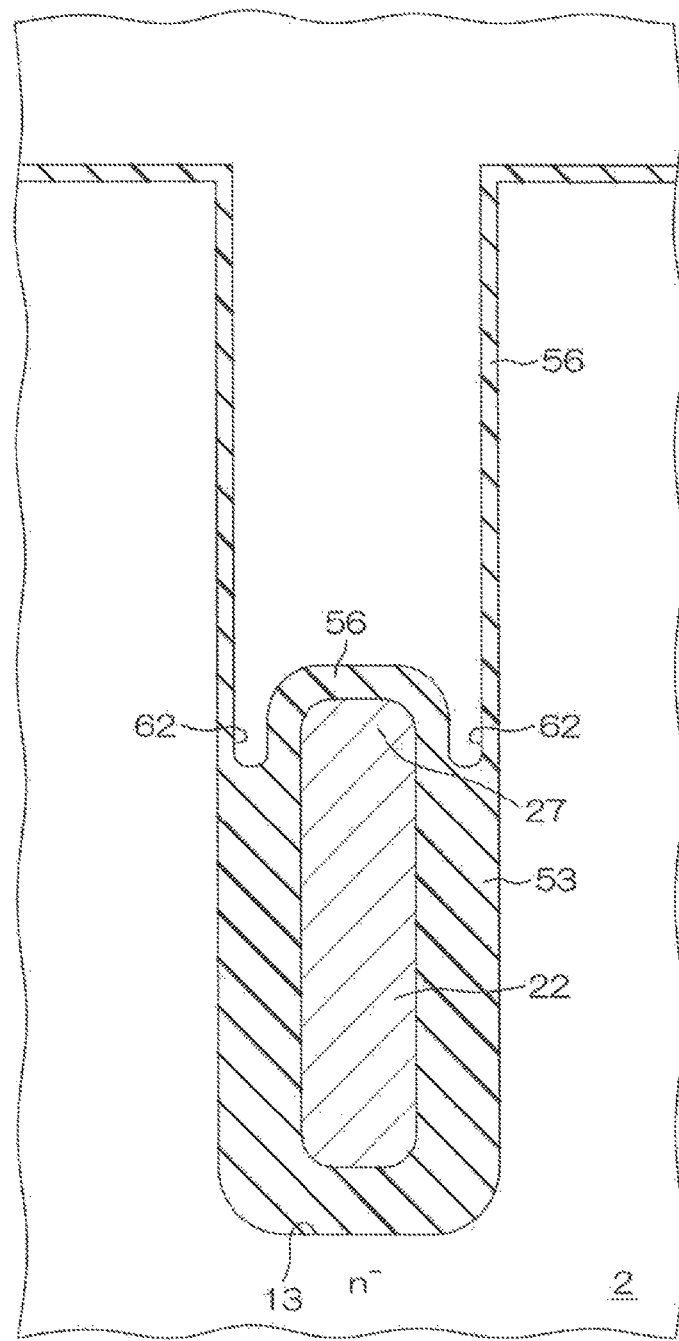

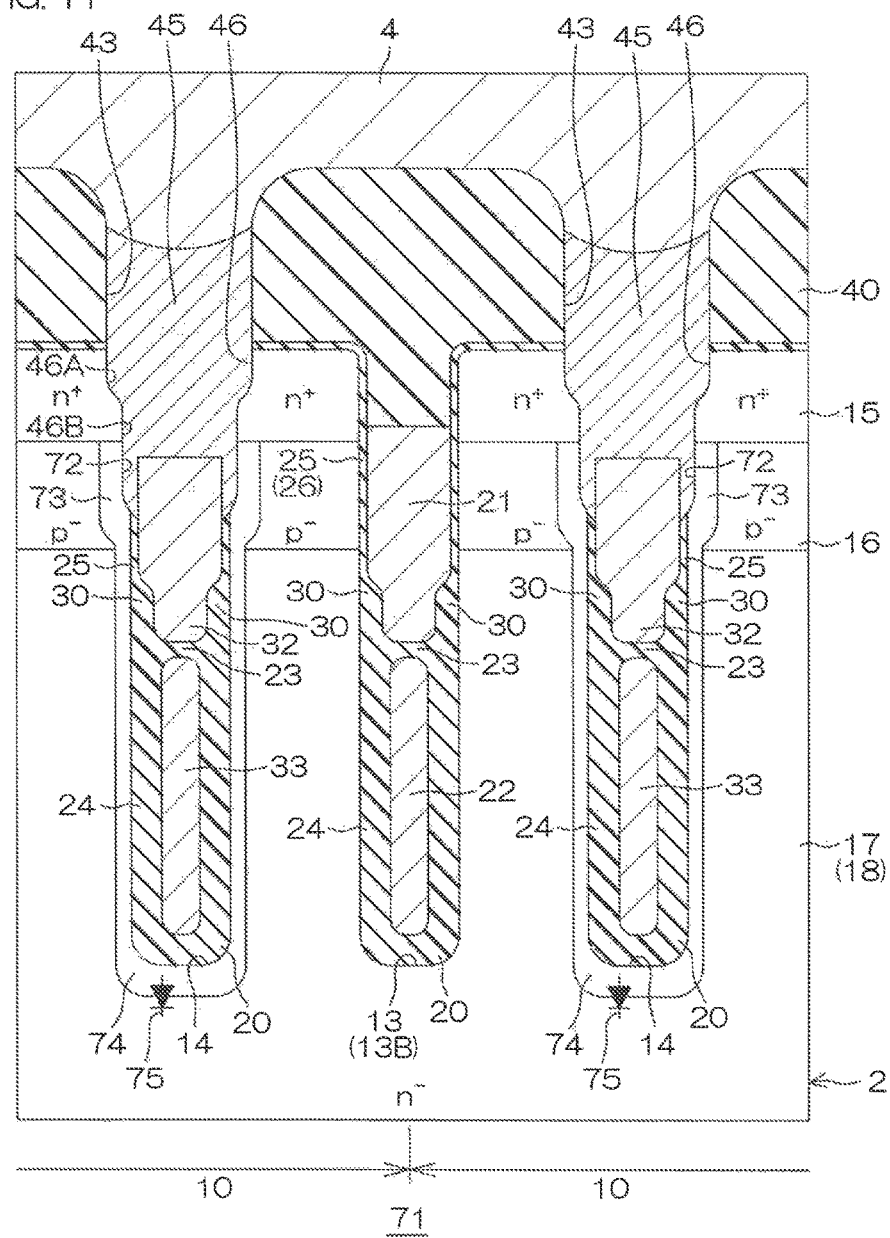

SEMICONDUCTOR DEVICE WITH ELECTRIC FIELD RELAXATION PORTION IN INSULATING LAYER BETWEEN LOWER AND UPPER TRENCH ELECTRODES

CROSS-REFERENCE TO RELATED APPLICATIONS

The present application corresponds to Japanese Patent Application No. 2015-165187 filed in the Japan Patent Office on Aug. 24, 2015, and the entire disclosure of this application is incorporated herein by reference.

TECHNICAL FIELD

The present invention relates to a semiconductor device and a method for manufacturing the same.

BACKGROUND ART

Patent Document 1 (Japanese Patent Application Publication No. 2006-202931) discloses a semiconductor device that includes a semiconductor substrate having a groove formed therein, an insulating layer formed on an inner surface of the groove, and a first conductor layer and a second conductor layer disposed above and below the insulating layer inside the groove.

SUMMARY OF INVENTION

With a trench structure having an upper electrode and a lower electrode disposed above and below an insulating film, there is a tendency for a comparatively high electric field to concentrate between a lower end portion of the upper electrode and a semiconductor layer. Therefore, with a trench structure, such as that of Patent Document 1, where no measures are taken, there is a problem in that a high electric field concentrates at the lower end portion of the upper electrode to destroy the insulating film inside the trench and consequently lower ESD tolerance.

An object of the present invention is thus to provide a semiconductor device, with which the ESD tolerance can be improved, and a method for manufacturing the same.

BRIEF DESCRIPTION OF DRAWINGS

FIG. 3 is a sectional view taken along line III-III in FIG. 2.

FIG. 4 is a sectional view taken along line IV-IV in FIG. 2.

FIG. 5 is an enlarged sectional view of a trench.

FIG. 6A to FIG. 6I are sectional views of portions of a manufacturing process for the semiconductor device.

FIG. 7 is an enlarged sectional view of a trench of a semiconductor device according to a reference example.

FIG. 8A to FIG. 8C are sectional views of portions of a manufacturing process for the semiconductor device shown in FIG. 7.

FIG. 11 is a sectional view of a semiconductor device according to a modification example.

DESCRIPTION OF EMBODIMENTS

Figure 1:
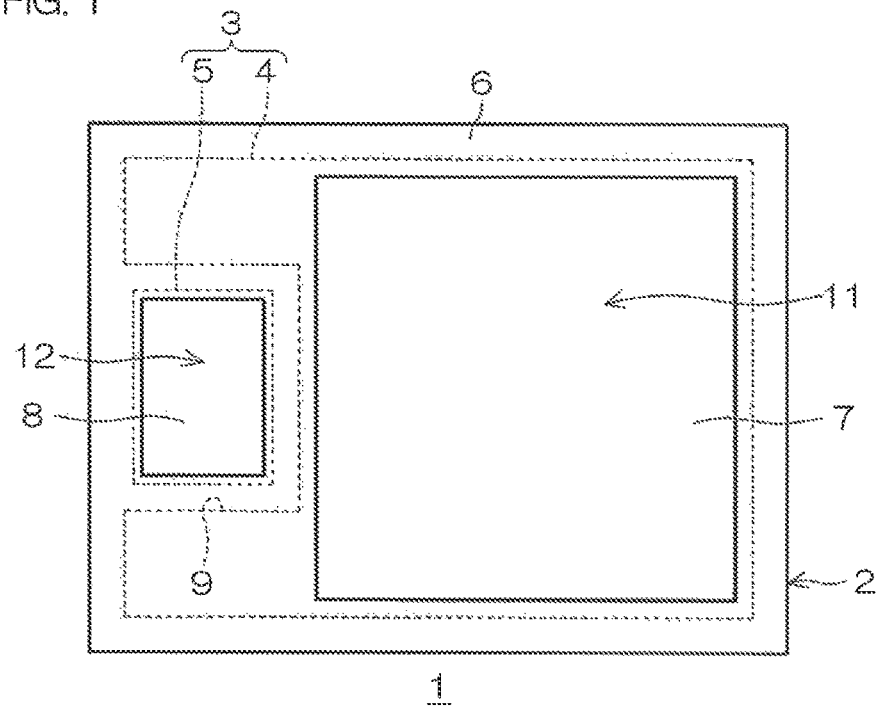
FIG. 1 is a schematic plan view of a semiconductor device according to a preferred embodiment of the present invention.

To achieve the above object, a semiconductor device according to one aspect of the present invention includes a semiconductor layer having a trench formed therein, a first insulating film formed along an inner surface of the trench, and an upper electrode and a lower electrode embedded in the trench via the first insulating film and disposed above and below a second insulating film. An electric field relaxation portion that relaxes an electric field arising between the upper electrode and the semiconductor layer is provided between a side surface of the trench and a lower end portion of the upper electrode.

With the present arrangement, the electric field relaxation portion is provided between the lower end portion of the upper electrode and the semiconductor layer where an electric field tends to concentrate relatively and therefore concentration of the electric field between the upper electrode and the semiconductor layer can be suppressed. A semiconductor device capable of being satisfactorily improved in ESD tolerance can thereby be provided.

In the semiconductor device, the first insulating film may include a thick film portion contacting the lower electrode and a thin film portion having a thickness less than the thickness of the thick film portion and contacting the upper electrode. In this case, the electric field relaxation portion is preferably constituted of an insulating film provided integral to and between the thick film portion and the thin film portion of the first insulating film and having a thickness greater than the thickness of the thin film portion. With the present arrangement, concentration of electric field between the upper electrode and the semiconductor layer can be suppressed satisfactorily by the electric field relaxation portion constituted of the insulating film that is thicker than the thin film portion of the first insulating film. A semiconductor device capable of being improved in ESD tolerance can thereby be provided.

In the semiconductor device, the electric field relaxation portion may have a thickness such that a ratio of the thickness of the electric field relaxation portion with respect to the thickness of the thin film portion of the first insulating film is greater than 1 and not more than 4. Also, the electric field relaxation portion may have a thickness less than the thickness of the thick film portion of the first insulating film. Also, the electric field relaxation portion may have a thickness such that a ratio of the thickness of the electric field relaxation portion with respect to the thickness of the thick film portion of the first insulating film is not less than 0.5 and less than 1. Also, the electric field relaxation portion may have a thickness greater than the thickness of the second insulating film. Also, the second insulating film may have a thickness greater than the thickness of the thin film portion of the first insulating film. Also, the electric field relaxation portion may be constituted of the same insulating material as the first insulating film.

The semiconductor device may further include a source layer, a body layer, and a drain layer formed in that order from a front surface side of the semiconductor layer at a side of the trench. In this case, the electric field relaxation portion may be in contact with the drain layer. Also, the electric field relaxation portion may be formed further to a rear surface side of the semiconductor layer than a boundary portion between the body layer and the drain layer or may be formed so as to cross the boundary portion between the body layer and the drain layer.

In the semiconductor device, an entirety of the upper electrode may be positioned higher than an upper end portion of the lower electrode across the second insulating film. Also in the semiconductor device, a projecting portion, provided along the side surface of the trench and projecting toward the lower electrode side, may be formed at the lower end portion of the upper electrode. In this case, the electric field relaxation portion is preferably in contact with the projecting portion of the upper electrode.

Here, an arrangement where the electric field relaxation portion is not formed between the side surface of the trench and the lower end portion of the upper electrode shall be considered. In this case, a comparatively high electric field concentrates at the projecting portion formed at the lower end of the upper electrode. With the present invention, the electric field relaxation portion is provided so as to contact the projecting portion and therefore the electric field that arises between the upper electrode and the semiconductor layer can be relaxed effectively. Preferably, an entirety of the projecting portion of the upper electrode is positioned higher than the upper end portion of the lower electrode across the second insulating film.

In the semiconductor device, a plurality of the trenches, including a gate trench, may be formed in the semiconductor layer. The upper electrode embedded in the gate trench may serve in common as a gate electrode. Also in the semiconductor device, a plurality of the trenches, including a field plate trench, may be formed in the semiconductor layer. The upper electrode embedded in the field plate trench may serve in common as a field plate.

In the semiconductor device, the upper electrode and the lower electrode may be constituted of polysilicon. The first insulating film may be constituted of silicon oxide.

A method for manufacturing a semiconductor device according to one aspect of the present invention includes the following steps (a) to (h).

(a) a step of forming a trench in a semiconductor layer (b) a step of forming a thick insulating film at an inner surface of the trench (c) a step of embedding a conductor to a middle of the trench in a depth direction to form a lower electrode (d) a step of thinning the thick insulating film, positioned between an opening of the trench and an upper end portion of the lower electrode, in a direction perpendicular to the inner surface of the trench to form a thin insulating film (e) a step of selectively removing the lower electrode so that the upper end portion of the lower electrode is positioned further to a bottom surface side of the trench than a boundary portion between the thick insulating film and the thin insulating film (f) a step of removing the thin insulating portion to thin the thick insulating film at least by just a thickness of the thin insulating film in the direction perpendicular to the inner surface of the trench (g) a step of forming an insulating film, thinner than the thick insulating film, so as to cover the inner surface of the trench and the upper end portion of the lower electrode that are exposed from the thick insulating film (h) a step of embedding a conductor in the trench to form an upper electrode By the present method, a semiconductor device, which includes a semiconductor layer having a trench formed therein, a first insulating film formed along an inner surface of the trench, and an upper electrode and a lower electrode embedded in the trench via the first insulating film and disposed above and below a second insulating film, can be manufactured. In the semiconductor device, an electric field relaxation portion that relaxes an electric field arising between the upper electrode and the semiconductor layer is provided between a side surface of the trench and a lower end portion of the upper electrode.

The first insulating film is formed through the respective steps of (b) to (g) and includes the thick insulating film (thick film portion) in contact with the lower electrode and the thin insulating film (thin film portion) having a thickness less than the thickness of the thick insulating film and contacting the upper electrode. The second insulating film is formed through the step of (g) and includes the thin insulating film covering the upper end portion of the lower electrode. The electric field relaxation portion is formed through the step of (f) and includes the thinned thick insulating film. The electric field relaxation portion includes an insulating film provided integral to and between the thick film portion and the thin film portion of the first insulating film and having a thickness greater than the thickness of the thin film portion of the first insulating film. By the present method, a semiconductor device can be manufactured with which concentration of electric field between the upper electrode and the semiconductor layer can be suppressed satisfactorily by the electric field relaxation portion including the insulating film thicker than the thin film portion of the first insulating film and ESD tolerance can be improved satisfactorily.

Preferred embodiments of the present invention shall now be described in detail with reference to the attached drawings.

FIG. 1 is a schematic plan view of a semiconductor device 1 according to a preferred embodiment of the present invention.

The semiconductor device 1 is a semiconductor device that includes, for example, a MISFET (metal insulator semiconductor field effect transistor) with a drain-source voltage $V_{ds}$ of not less than 10V and not more than 200V (30V in the present preferred embodiment). More specifically, the semiconductor device 1 includes a semiconductor substrate 2 as an example of a semiconductor layer of the present invention. The semiconductor substrate 2 has a rectangular shape in a plan view. An electrode film 3, constituted, for example, of a metal material (Al, etc.), is formed on a front surface of the semiconductor substrate 2. The electrode film 3 may include a source metal 4 and a gate metal 5.

The source metal 4 is formed to cover substantially an entirety of a central portion of the semiconductor substrate 2, and the gate metal 5 is formed at a peripheral edge portion of the semiconductor substrate 2. The source metal 4 and the gate metal 5 are covered by a passivation film 6. Portions of the source metal 4 and the gate metal 5 are exposed from the passivation film 6 as a source pad 7 and a gate pad 8, respectively. Bonding members, such as bonding wires, etc. (not shown), may be bonded to the source pad 7 and the gate pad 8.

A boundary portion 9, at which the material of the electrode film 3 is selectively removed, is set up between the source metal 4 and the gate metal 5. The boundary portion 9 may surround the gate metal 5 as shown in FIG. 1 or may have a rectilinear shape along a portion of a peripheral edge of the gate metal 5. An active region 11, in which multiple unit cells 10 of the MISFET to be described later are formed, and an inactive region 12 besides the active region 11 may be set up on the semiconductor substrate 2. The active region 11 may be disposed in a region below the source pad 7 of the source metal 4. On the other hand, the inactive region 12 may be disposed in a region below the gate metal 5 and across the boundary portion 9 so as to extend to a region below a portion outside the source pad 7 of the source metal 4.

Figure 2:
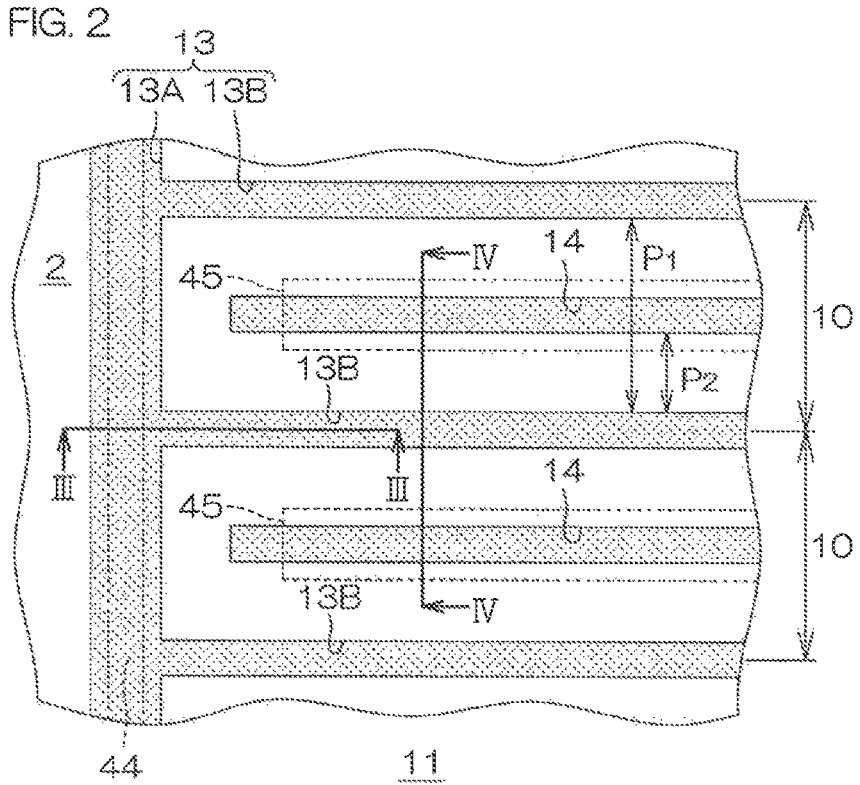
FIG. 2 is a schematic plan view of the structure of an active region.

FIG. 2 is a schematic plan view of the structure of the active region 11. FIG. 3 is a sectional view taken along line III-III in FIG. 2. FIG. 4 is a sectional view taken along line IV-IV in FIG. 2. FIG. 5 is an enlarged sectional view of a gate trench 13.

The semiconductor device 1 includes the semiconductor substrate 2. The semiconductor substrate 2 may, for example, be a silicon substrate. The semiconductor substrate 2 may include abase substrate and an epitaxial layer on the base substrate. Gate trenches 13 and field plate trenches 14 are formed in the semiconductor substrate 2. The gate trenches 13 include a first gate trench 13A for contact that is led out from the gate pad 8 and a plurality of second gate trenches 13B led out in the shape of stripes from the first gate trench 13A.

The first gate trench 13A supplies power, input into the gate pad 8, to the plurality of second gate trenches 13B. The plurality of second gate trenches 13B define, between each other, the unit cells 10 of the MISFET. In the present preferred embodiment, the first gate trench 13A and the second gate trenches 13B are mutually orthogonal in a plan view. Unless noted otherwise in particular, the first gate trench 13A and the second gate trenches 13B shall be referred to collectively as the gate trenches 13.

One each of the field plate trenches 14 may be formed parallel to the gate trenches 13 in each unit cell 10. A pitch $P_1$ of gate trenches 13 that are mutually adjacent across a field plate trench 14 may, for example, be not less than 1.0 μm and not more than 3.0 μm. Also, a pitch $P_2$ between a gate trench 13 and a field plate trench 14 may, for example, be not less than 0.4 μm and not more than 2.0 μm. The gate trenches 13 and the field plate trenches 14 have the same depth.

Referring to FIG. 3 and FIG. 4, impurity regions, such as an $n^+$ type source layer 15, a $p^-$ type body layer 16, an $n^-$ type drain layer 17, etc., are formed in each unit cell 10. The source layer 15, the body layer 16, and the drain layer 17 are aligned and disposed in that order in a thickness direction directed from the front surface to a rear surface of the semiconductor substrate 2. Thus at side surfaces of both the gate trenches 13 and the field plate trenches 14, the source layer 15, the body layer 16, and the drain layer 17 are exposed in that order from respective opening ends. The drain layer 17 also spreads to a region below the gate trenches 13 and the field plate trenches 14 to constitute a drift layer 18 of the MISFET.

Concentrations of the respective impurity regions shall now be described additionally. The n type impurity concentration of the source layer 15 is, for example, not less than $1\times10^{20}$ cm$^{-3}$ and not more than $1\times10^{22}$ cm$^{-3}$. The p type impurity concentration of the body layer 16 is, for example, not less than $1\times10^{17}$ cm$^{-3}$ and not more than $1\times10^{19}$ cm$^{-3}$. The n type impurity concentration of the drain layer 17 (drift layer 18) is, for example, not less than $1\times10^{16}$ cm$^{-3}$ and not more than $1\times10^{18}$ cm$^{-3}$.

Referring to FIG. 5, a first insulating film 20 is formed on an inner surface of each gate trench 13. A gate electrode 21 as an example of an upper electrode of the present invention and an embedded electrode 22 as an example of a lower electrode of the present invention are embedded via the first insulating film 20 in the gate trench 13. The gate electrode 21 and the embedded electrode 22 are disposed while being electrically separated (insulated) vertically by a second insulating film 23 disposed between the two. The first insulating film 20 and the second insulating film 23 are formed integrally of the same material. The first insulating film 20 and the second insulating film 23 may include, for example, silicon oxide films.

The first insulating film 20 includes a thick film portion 24 contacting the embedded electrode 22 and a thin film portion 25 contacting the gate electrode 21. The thick film portion 24 of the first insulating film 20 has one surface (surface at the drain layer 17 side) and another surface opposite thereof formed along inner walls of the gate trench 13 and has a laminated structure in which a silicon oxide film of low denseness is laminated on a silicon oxide film of high denseness.

A thickness T1 of the thick film portion 24 of the first insulating film 20 is greater than a thickness T2 of the thin film portion 25 of the first insulating film 20 (thickness T2<thickness T1). The thickness T1 of the thick film portion 24 of the first insulating film 20 is greater than a thickness T3 of the second insulating film 23 (thickness T3<thickness T1). The thickness T3 of the second insulating film 23 is greater than the thickness T2 of the thin film portion 25 of the first insulating film 20 (thickness T2<thickness T3<thickness T1).

The gate electrode 21 is constituted, for example, of polysilicon. The gate electrode 21 faces the source layer 15, the body layer 16, and the drain layer 17 via the thin film portion 25 of the first insulating film 20. The gate electrode 21 forms a channel in the body layer 16 at the side surface of the gate trench 13. That is, the thin film portion 25 of the first electrode film 20 serves in common as a gate insulating film 26. An entirety of the gate electrode 21 is positioned higher than an upper end portion 27 of the embedded electrode 22 across the second insulating film 23. A projecting portion 29, projecting toward the embedded electrode 22 side, is formed along the side surface of the gate trench 13 at a lower end portion 28 of the gate electrode 21. An entirety of the projecting portion 29 of the gate electrode 21 is positioned higher than the upper end portion 27 of the embedded electrode 22 across the second insulating film 23.

The embedded electrode 22 is constituted, for example, of polysilicon. The embedded electrode 22 faces the drift layer 18 across the thick film portion 24 of the first insulating film 20. The embedded electrode 22 may be electrically floated from the exterior by being covered by the first insulating film 20 and the second insulating film 23 or may be equipotential (at a ground potential) with the source metal 4. An electric field relaxation portion 30, which relaxes an electric field arising between the gate electrode 21 and the semiconductor substrate 2 or more specifically the drain layer 17 (drift layer 18), is provided between the side surface of the gate trench 13 and the lower end portion 28 of the gate electrode 21.

The electric field relaxation portion 30 is constituted of an insulating film that is provided integrally between the thick film portion 24 and the thin film portion 25 of the first insulating film 20. The electric field relaxation portion 30 is further integral to the second insulating film 23 and is formed of the same material (silicon oxide film in the present preferred embodiment) as the first insulating film 20 and the second insulating film 23. As with the thick film portion 24 of the first insulating film 20, the electric field relaxation portion 30 may have a laminated structure in which a silicon oxide film of low denseness is laminated on a silicon oxide film of high denseness.

The electric field relaxation portion 30 is formed to contact the drain layer 17 (drift layer 18). In the present preferred embodiment, the electric field relaxation portion 30 is formed further to the rear surface side of the semiconductor substrate 2 than a boundary portion between the body layer 16 and the drain layer 17 (drift layer 18) so that an entirety thereof contacts the drain layer 17 (drift layer 18). That is, in the present preferred embodiment, electric field relaxation portion 30 does not contact the body layer 16. The electric field relaxation portion 30 may be formed so as to cross the boundary portion between the body layer 16 and the drain layer 17 (drift layer 18) so that a portion thereof contacts the body layer 16. The projecting portion 29 of the gate electrode 21 is more specifically formed by the gate electrode 21 (polysilicon) entering into a depression 31 formed between the electric field relaxation portion 30 and the second insulating film 23. The electric field relaxation portion 30 thus contacts the projecting portion 29 of the gate electrode 21.

The electric field relaxation portion 30 has a thickness T4 less than the thickness T1 of the thick film portion 24 of the first insulating film 20 and greater than the thickness T2 of the thin film portion 25 of the first insulating film 20. The thickness T4 of the electric field relaxation portion 30 is greater than the thickness T3 of the second insulating film 23 (thickness T2<thickness T3<thickness T4<thickness T1). Viewed in another way, the first insulating film 20 is formed to thicken stepwise along a depth direction of the trench and a portion contacting the lower end portion 28 of the gate electrode 21 is formed thicker than the portion that becomes the gate insulating film 26 (that is, the thin film portion 25).

A ratio $R_1$ (=T4/T1) of the thickness T4 of the electric field relaxation portion 30 with respect to the thickness T1 of the thick film portion 24 of the first insulating film 20 may be not less than 0.5 and less than 1 ($0.5 \leq R_1 < 1$). Also, a ratio $R_2$ (=T4/T2) of the thickness T4 of the electric field relaxation portion 30 with respect to the thickness T2 of the thin film portion 25 of the first insulating film 20 may be greater than 1 and not more than 4 ($1 < R_2 \leq 4$). Also, the electric field relaxation portion 30 may be formed so that in the thickness direction of the gate trench 13, a ratio $R_3$ (=T6/T5) of a thickness T6 of the electric field relaxation portion 30 with respect to a thickness T5 of the gate electrode 21 is, for example, not less than 0.05 and not more than 0.25 ($0.05 \leq R_3 \leq 0.25$).

The respective thicknesses of the first insulating film. 20, the second insulating film. 23, and the electric field relaxation portion 30 shall now be described additionally. The thickness T1 of the thick film portion 24 of the first insulating film 20 may, for example, be not less than 500 Å and not more than 2000 Å. The thickness T2 of the thin film portion 25 of the first insulating film 20 may, for example, be not less than 200 Å and not more than 750 Å. The thickness T3 of the second insulating film 23 may, for example, be not less than 250 Å and not more than 800 Å. The thickness T4 of the electric field relaxation portion 30 may, for example, be not less than 300 Å and not more than 1000 Å.

Referring to FIG. 4, the first insulating film 20, the second insulating film 23, and the electric field relaxation portion 30 are also formed inside each field plate trench 14. The respective arrangements of the first insulating film 20, the second insulating film 23, and the electric field relaxation portion 30 inside the field plate trench 14 are substantially the same as the respective arrangements in each gate trench 13. Just the points of difference shall be described below. A field plate 32 as an example of the upper electrode of the present invention and an embedded field plate 33 as an example of the lower electrode of the present invention are embedded via the first insulating film 20 in the field plate trench 14. The field plate 32 and the embedded field plate 33 are disposed while being electrically separated (insulated) vertically by the second insulating film 23 disposed between the two.

An upper end of the thin film portion 25 of the first insulating film 20 in the field plate trench 14 may be positioned at a middle of the field plate trench 14 in its depth direction. For example, the upper end of the thin film portion 25 of the first insulating film 20 may be at a depth position of the body layer 16 at a side surface of the field plate trench 14 as shown in FIG. 4.

The field plate 32 is constituted, for example, of polysilicon. The field plate 32 faces the body layer 16 and the drain layer 17 across the first insulating film 20. The field plate 32 may have an upper surface at a position lower than an upper surface of the gate electrode 21 with respect to the front surface of the semiconductor substrate 2. The upper surface position of the field plate 32 may, for example, be lower than a boundary portion between the source layer 15 and the body layer 16 or may be at a middle of the body layer 16 in the thickness direction.

The embedded field plate 33 is constituted, for example, of polysilicon. The embedded field plate 33 faces the drift layer 18 across the thick film portion 24 of the first insulating film 20. The embedded field plate 33 may be electrically floated from the exterior by being covered by the first insulating film 20 and the second insulating film 23 or may be equipotential (at a ground potential) with the source metal 4.

Referring to FIG. 3 and FIG. 4, an interlayer insulating film 40 is formed on the semiconductor substrate 2. The interlayer insulating film 40 includes at least one of either of a silicon oxide film and a silicon nitride film. The interlayer insulating film 40 may include a silicon nitride film and a silicon oxide film formed in that order from the front surface side of the semiconductor substrate 2. The interlayer insulating film 40 enters into a recess portion 41 formed by a height difference between the upper surface of the gate electrode 21 and the front surface of the semiconductor substrate 2. A contact hole 42 exposing the first gate trench 13A and contact holes 43 exposing the field plate trenches 14 are formed in the interlayer insulating film 40. The gate metal 5 and the source metal 4 are formed on the interlayer insulating film 40.

The gate metal 5 is connected to a gate contact 44 embedded in the contact hole 42 (also see a broken line portion in FIG. 2). The gate contact 44 is constituted, for example, from a tungsten plug and enters into the first gate trench 13A. Inside the first gate trench 13A, the gate contact 44 is electrically connected to the gate electrode 21. A connection portion of the gate contact 44 and the gate electrode 21 inside the first gate trench 13A may be positioned lower than the upper surface of the gate electrode 21 inside the second gate trench 13B.

On the other hand, the source metal 4 is connected to source contacts 45 embedded in the contact holes 43 (also see broken line portions in FIG. 2). Each source contact 45 is constituted, for example, of a tungsten plug and enters into the field plate trench 14. Inside the field plate trench 14, the source contact 45 is electrically connected to the field plate 32.

On the other hand, as with each gate trench 13, a recess portion 46 is formed by a height difference between an upper surface of the field plate 32 and the front surface of the semiconductor substrate 2 in each field plate trench 14 as well. The recess portion 46 may be formed in self-alignment with respect to the contact hole 43. The recess portion 46 may thereby be made to have a side surface that is smoothly continuous without a step to an inner surface of the contact hole 43.

The side surface of the recess portion 46 may, for example, have a first surface 46A, which narrows in diameter from an opening end portion to a middle of the source layer 15 in the thickness direction, and have a second surface 46B, of substantially the same width as a bottom portion of the field plate trench 14, at a portion deeper than the first surface 46A. At the side surface of the recess portion 46, the source contact 45 unitedly contacts the source layer 15 at both sides. On the other hand, a bottom portion of the recess portion 46 is constituted of the upper surface of the field plate 32 and an upper end of the first insulating film 20.

A method for manufacturing the semiconductor device 1 shall now be described. FIG. 6A to FIG. 6I are views showing portions of a manufacturing process for the semiconductor device 1 in the order of process. The structure inside each gate trench 13 and the structure inside each field plate trench 14 are substantially the same and therefore in FIG. 6A to FIG. 6I, only the processes for portions corresponding to FIG. 5 are shown.

To manufacture the semiconductor device 1, first, the semiconductor substrate 2 in a wafer state is prepared. The semiconductor substrate 2 is an n⁻ type silicon substrate and forms the n⁻ type drain layer 17 of the semiconductor device 1. Then as shown in FIG. 6A, the semiconductor substrate 2 is selectively etched via a hard mask 50 constituted of silicon oxide. The gate trenches 13 and the field plate trenches 14 are thereby formed at the same time and the unit cells 10 are defined in the semiconductor substrate 2.

Next, the semiconductor substrate 2 is subject to thermal oxidation processing to form a thermal oxide film 51 at the respective inner surfaces of the gate trenches 13 and the field plate trenches 14 and the front surface of the semiconductor substrate 2 as shown in FIG. 6B. The thermal oxide film 51 may have a thickness of, for example, not less than 200 Å and not more than 1000 Å. Silicon oxide is then deposited on the thermal oxide film 51 by a CVD (chemical vapor deposition) or PVD (physical vapor deposition) method.

A deposited insulating film 52 is thereby formed on the thermal oxide film 51. The deposited insulating film 52 may have a thickness of, for example, not less than 200 Å and not more than 1000 Å. The deposited insulating film 52 is a film that is lower in denseness in comparison to the thermal oxide film 51. The inner surfaces of the gate trenches 13 and the field plate trenches 14 are thereby covered by a thick insulating film 53 constituted of a laminated film of the thermal oxide film 51 and the deposited insulating film 52 that differ mutually in denseness.

Next, a polysilicon film 54 is deposited as a conductor on the semiconductor substrate 2. The polysilicon film 54 fills the gate trenches 13 and the field plate trenches 14 and covers the front surface of the semiconductor substrate 2. Thereafter, an n type impurity is implanted into the polysilicon film 54 and made to diffuse by heat treatment (drive-in). As examples of the n type impurity, P (phosphorus), As (arsenic), etc., can be cited.

Next, the polysilicon film 54 is etched as shown in FIG. 6C. The etching of the polysilicon film 54 is continued until an etching surface reaches a middle of each gate trench 13 and field plate trench 14 in the depth direction. The embedded electrode 22 and the embedded field plate 33 that are constituted of the remaining polysilicon film 54 are thereby formed in each gate trench 13 and each field plate trench 14, respectively.

Figure 6D:
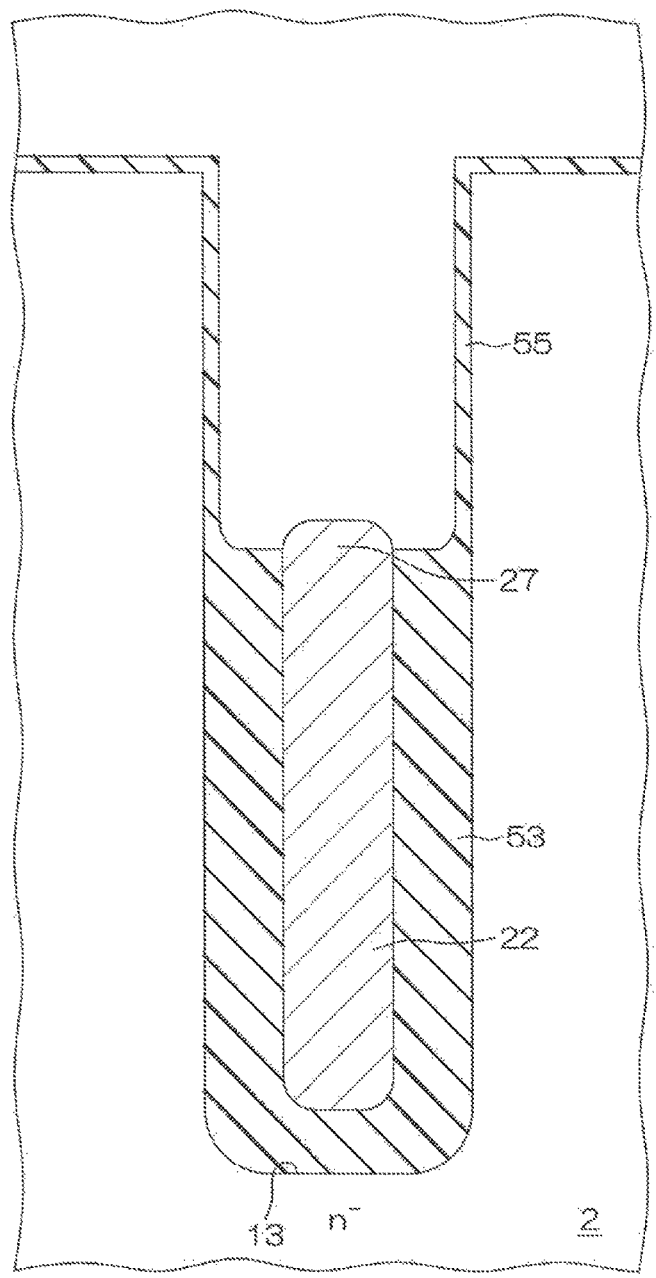

Next, the thick insulating film 53 positioned between an opening of each gate trench 13 and the upper end portion 27 of the embedded electrode 22 and the thick insulating film 53 positioned between an opening of each field plate trench 14 and the upper end portion of the embedded field plate 33 are etched as shown in FIG. 6D. The thick insulating film 53 is removed so that a portion remains at the inner surface of each gate trench 13 and field plate trench 14. In this process, the thick insulating film 53 is removed at least by just an amount corresponding to the thickness of the removed thick insulating film 53 in the depth direction of each gate trench 13 and field plate trench 14.

The thick insulating film 53 is thereby thinned in a direction perpendicular to the inner surface of each gate trench 13 and the field plate trench 14 to form a thin insulating film 55 and an upper end portion of each gate trench 13 and the field plate trench 14 becomes exposed from the thick insulating film 53. The etching performed here may be wet etching. The thin insulating film 55 may have a thickness, for example, of not less than 100 Å and not more than 1000 Å.

Next, a portion of each embedded electrode 22 and a portion of each embedded field plate 33 are selectively etched as shown in FIG. 6E. More specifically, the upper end portion 27 of each embedded electrode 22 and the upper end portion of each embedded field plate 33 are etched so as to be positioned further toward the bottom surface sides of the gate trench 13 and the field plate trench 14 than a boundary portion between the thick insulating film 53 and the thin insulating film 55. The etching performed here may be dry etching, or more specifically RIE (reactive ion etching).

Next, the thin insulating film 55 is removed by etching as shown in FIG. 6F. At the same time, the thick insulating film 53 is thinned at least by just an amount corresponding to the thickness of the thin insulating film 55 in the direction perpendicular to the inner surface of each gate trench 13 and field plate trench 14. Also, the thick insulating film 53 is removed at least by just an amount corresponding to the thickness of the thin insulating film 55 in the depth direction of each gate trench 13 and field plate trench 14. The upper end portion 27 of each embedded electrode 22 and the upper end portion of each embedded field plate 33 thereby become exposed from the thick insulating film 53.

Next, the semiconductor substrate 2 is subject to thermal oxidation processing to form a thermal oxide film 56 at the exposed side surfaces of the gate trenches 13 and the field plate trenches 14 that were made apparent by the etching of the thin insulating film 55 and at the front surface of the semiconductor substrate 2 as shown in FIG. 6G. In this process, the upper end portion of each of the embedded electrodes 22 and embedded field plates 33 is also oxidized and the thermal oxide film 56 is formed thereat. At the upper end portion of each of the embedded electrodes 22 and embedded field plates 33, oxidation progresses further than at the exposed side surfaces of the gate trenches 13 and the field plate trenches 14 due to the polysilicon with impurity introduced therein and consequently, a comparatively thick thermal oxide film 56 is formed.

The first insulating film 20, the second insulating film 23, and the electric field relaxation portion 30 are thereby formed. The first insulating film 20 includes the thick insulating film 53 as the thick film portion 24 and the thermal oxide film 56, formed on the exposed side surface of each of the gate trenches 13 and field plate trenches 14, as the thin film portion 25. The second insulating film 23 includes the thermal oxide film 56 formed on the upper end portion of each of the embedded electrodes 22 and embedded field plates 33. The electric field relaxation portion 30 includes the thick insulating film 53 that was thinned in the process of FIG. 6F.

Next, a polysilicon film 57 is deposited as a conductor on the semiconductor substrate 2 as shown in FIG. 6H. The polysilicon film 57 fills the gate trenches 13 and the field plate trenches 14 and covers the front surface of the semiconductor substrate 2. Thereafter, an n type impurity is implanted into the polysilicon film 57 and made to diffuse by heat treatment (drive-in). The polysilicon film. 57 is then etched.

The etching of the polysilicon film 57 is continued until an etching surface reaches a position slightly further inward into each gate trench 13 and field plate trench 14 than the front surface of the semiconductor substrate 2. The gate electrode 21 and the field plate 32 that are constituted of the remaining polysilicon film 57 are thereby formed in each gate trench 13 and each field plate trench 14, respectively. The recess portions 41 and 47 are also formed thereabove.

Next, an n type impurity and a p type impurity are implanted successively into the semiconductor substrate 2 as shown in FIG. 6I. Thereafter, the implanted impurity ions are made to diffuse by heat treatment (drive-in). The n$^+$ type source layer 15 and the p$^-$ type body layer 16 are thereby formed. Next, a silicon nitride film and a silicon oxide film are deposited successively, for example, by the CVD method. The interlayer insulating film 40 is thereby formed.

Next, the interlayer insulating film 40 is etched selectively by RIE to form the contact holes 42 and 43 (also see FIG. 3 and FIG. 4). In the process of etching, in the first gate trench 13A, the gate electrode 21 is etched gradually from its upper surface so that the upper surface of the gate electrode 21 becomes depressed. On the other hand, in each field plate trench 14, the source layer 15 is etched gradually from the side surface of the recess portion 46 and the field plate 32 is etched gradually from its upper surface.

The side surface that includes a tapered surface is thereby formed at the recess portion 46 and the position of the upper surface of the field plate 32 is lowered downward. After the gate contacts 44 and the source contacts 45 are embedded in the contact holes 42 and 43, the electrode film 3 is formed to cover the regions on the semiconductor substrate 2. Thereafter, the electrode film 3 is patterned to form the source metal 4 and the gate metal 5. The semiconductor device 1 is obtained by the above processes.

FIG. 7 is an enlarged sectional view of the gate trench 13 of a semiconductor device 60 according to a reference example. The semiconductor device 60 according to the reference example differs from the semiconductor device 1 of the present preferred embodiment in that the electric field relaxation portion 30 is not formed in the gate trenches 13 and the field plate trenches 14. In the following, the arrangement at the gate trench 13 (second gate trench 13B) side shall be described and description of the arrangement at the field plate trench 14 side shall be omitted.

In the semiconductor device 60 according to the reference example, a projecting portion 61, extending downward between the side surface of the gate trench 13 and the upper end portion 27 of the embedded electrode 22, is formed at the lower end portion 28 of the gate electrode 21. The projecting portion 61 faces the upper end portion 27 of the embedded electrode 22 across the second insulating film 23 in a direction orthogonal to the depth direction of the gate trench 13. Also, the projecting portion 61 faces the drain layer 17 (drift layer 18) across the thin film portion 25 of the first insulating film 20. Points besides the above are substantially the same as those of the semiconductor device 1 of the present preferred embodiment and description thereof shall thus be omitted.

Figure 8A:
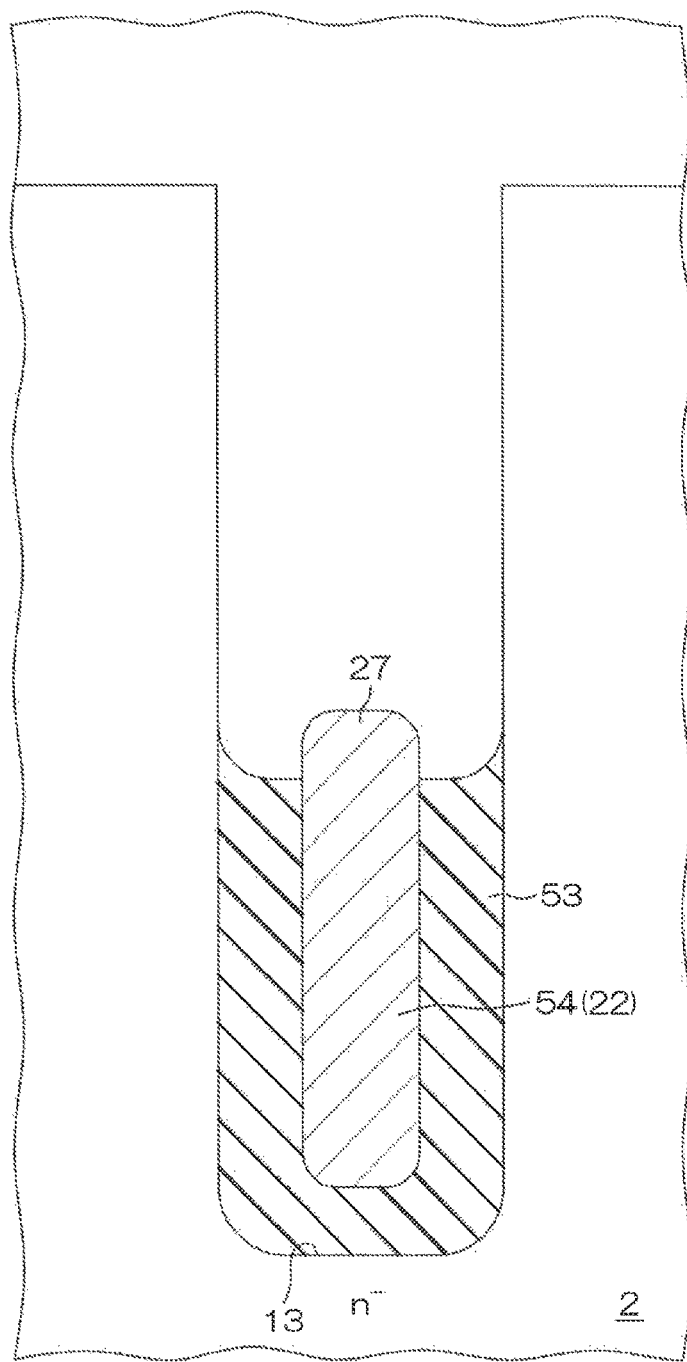
Figure 8C:
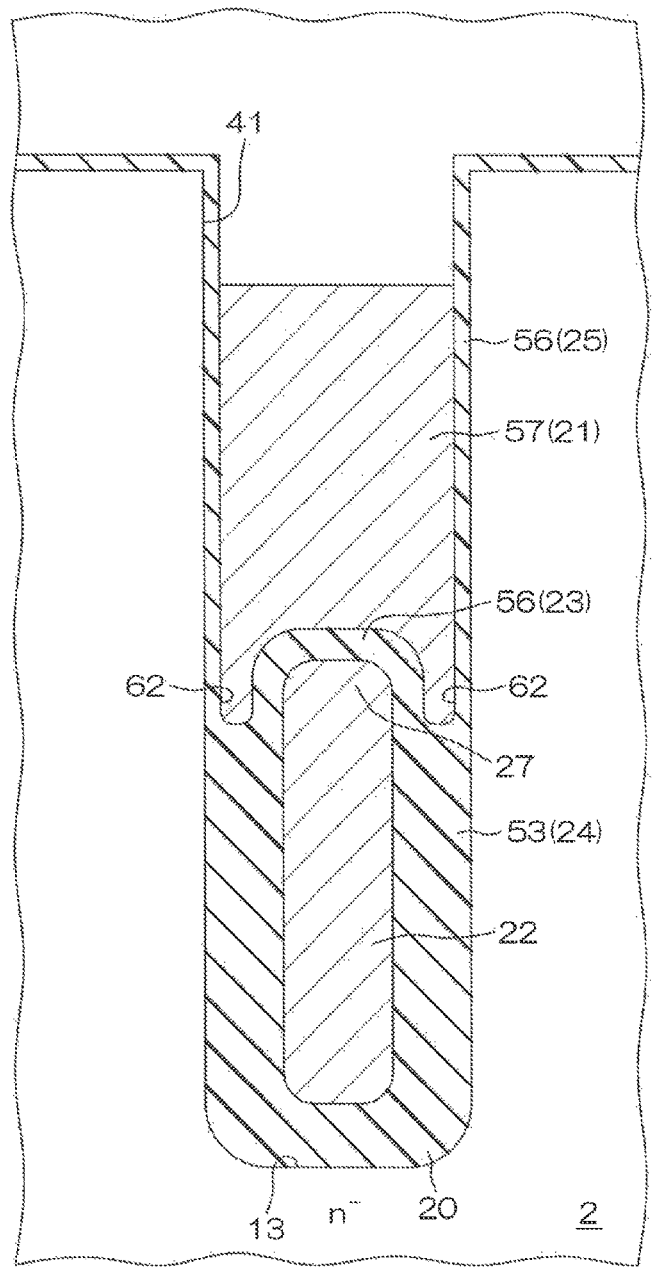

FIG. 8A to FIG. 8C are sectional views of portions of a manufacturing process for the semiconductor device 60 according to the reference example. In manufacturing the semiconductor device 60 according to the reference example, first, the process of FIG. 6A and the process of 6B described above are executed. Next, the polysilicon film 54 is etched to a middle of each gate trench 13 in the depth direction as shown in FIG. 8A.

Next, the thick insulating film 53 positioned between the opening of the gate trench 13 and the upper end portion 27 of the embedded electrode 22 is removed, for example, by etching. The thick insulating film 53 is removed until the gate trench 13 and the inner surface of the gate trench 13 are exposed. In this process, the thick insulating film 53 is also removed at least by just an amount corresponding to the thickness of the removed thick insulating film 53 in the depth direction of the gate trench 13. The upper end portion 27 of the embedded electrode 22 is thereby exposed from the thick insulating film 53.

Next, the semiconductor substrate 2 is subject to thermal oxidation processing to form the thermal oxide film 56 at the exposed side surface of the gate trench 13 that was made apparent by the etching of the thick insulating film 53 and at the front surface of the semiconductor substrate 2 as shown in FIG. 8B. In this process, the upper end portion 27 of the embedded electrode 22 is also oxidized and the thermal oxide film 56 is formed thereat. The first insulating film 20 and the second insulating film 23 are thereby formed. In the present process, a recess 62 is defined between the upper end portion 27 of the embedded electrode 22 and the side surface of the gate trench 13 by the first insulating film 20 and the second insulating film 23.

Next, the polysilicon film 57 is deposited as a conductor on the semiconductor substrate 2 as shown in FIG. 8C. The polysilicon film 57 fills the gate trench 13 and covers the front surface of the semiconductor substrate 2. The polysilicon film 57 enters into the recess 62 inside the gate trench 13 to form, between the side surface of the gate trench 13 and the upper end portion 27 of the embedded electrode 22, the projecting portion 61 extending downward therebetween. Thereafter, the same processes as those of the semiconductor device 1 according to the present preferred embodiment are executed and the semiconductor device 60 according to the reference example is thereby manufactured.

With a semiconductor device, such as the semiconductor device 60 according to the reference example, that is manufactured through the processes of FIG. 8A to FIG. 8C or processes similar thereto, the projecting portion 61 is formed between the upper end portion of each embedded electrode 22 and embedded field plate 33 and the side surface of each gate trench 13 and field plate trench 14 so as to extend downward therebetween. The projecting portion 61 faces the drain layer 17 (drift layer 18) across the thin film portion 25 of the first insulating film 20 and therefore a comparatively high electric field concentrates thereat. The high electric field that concentrates at the lower end portion of each gate electrode 21 and field plate 32 actually arises due to the projecting portion 61. There is a problem that when such a high electric field concentrates at the lower end portion of each gate electrode 21 and field plate 32, the first insulating film 20, the second insulating film 23, etc., inside each gate trench 13 and field plate trench 14 become destroyed or degraded. This consequently causes a problem of inviting lowering of ESD tolerance of the semiconductor device and increase of drain cutoff current $I_{dss}$ rise percentage.

Thus with the present preferred embodiment, the electric field relaxation portion 30 is provided between the side surface of each gate trench 13 and field plate trench 14 and the lower end portion of each gate electrode 21 and field plate 32. With reference to FIG. 5, in the present preferred embodiment, although the comparatively small projecting portion 29 is formed, the electric field relaxation portion 30, constituted of the insulating film thicker than the thin film portion 25 (gate insulating film 26) of the first insulating film 20, is present between the projecting portion 29 and the drain layer 17 (drift layer 18).

Figure 9:
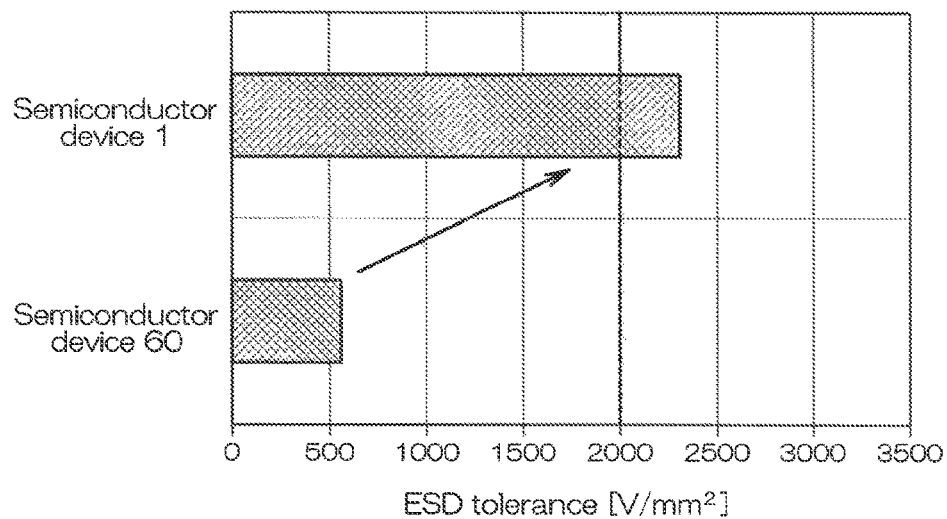
FIG. 9 is a diagram for comparing ESD tolerances of the semiconductor device according to the present invention and the semiconductor device according to the reference example.

The concentration of electric field between each gate electrode 21 and field plate 32 and the drain layer 17 (drift layer 18) can thus be suppressed by the electric field relaxation portion 30 and therefore the semiconductor device 1 capable of effectively improving the ESD tolerance as shown in FIG. 9 can be provided. FIG. 9 is a diagram for comparing the ESD tolerances of the semiconductor device 1 according to the present invention and the semiconductor device 60 according to the reference example. With reference to FIG. 9, the ESD tolerance of the semiconductor device 60 according to the reference example was approximately 550V. In contrast, the ESD tolerance of the semiconductor device 1 according to the present preferred embodiment was not less than 2000V and not more than 2500V. The semiconductor device 1 capable of effectively improving the ESD tolerance can thus be provided by the arrangement of the present preferred embodiment.

Also, occurrence of leakage current between the drain layer 17 and each gate electrode 21 and between the drain layer 17 and each field plate 32 can be suppressed because the electric field at each gate electrode 21 and field plate 32 can be relaxed by the electric field relaxation portion 30. Rise of the drain cutoff current $I_{dss}$ can thereby be suppressed effectively as shown in FIG. 10.

Figure 10:
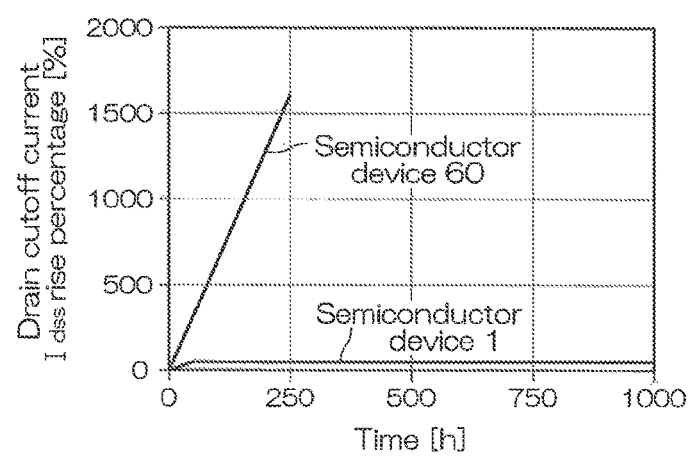
FIG. 10 is a diagram for comparing drain cutoff current rise percentages of the semiconductor device according to the present invention and the semiconductor device according to the reference example.

FIG. 10 is a diagram for comparing drain cutoff current $I_{dss}$ rise percentages of the semiconductor device 1 according to the present invention and the semiconductor device 60 according to the reference example. The drain cutoff current $I_{dss}$ is defined as a drain-source current when a predetermined drain-source voltage $V_{ds}$ is applied under a predetermined temperature with a gate electrode and a source electrode being short-circuited. FIG. 10 shows the results of examining the drain cutoff current $I_{dss}$ rise percentage with time when a drain-source voltage $V_{ds}$ of 30V is applied continuously for 1000 hours under a temperature of 150° C.

Referring to FIG. 10, with the semiconductor device 60 according to the reference example, the drain cutoff current $I_{dss}$ rise percentage exceeded 1500% in 250 hours. In contrast, with the semiconductor device 1 according to the present invention, the drain cutoff current $I_{dss}$ rise percentage at the point of elapse of 1000 hours was not less than 10% and not more than 65%.

Thus by the arrangement of the present preferred embodiment, the semiconductor device 1 can be provided with which the ESD tolerance can be improved effectively and the percentage of drain cutoff current $I_{dss}$ rise with time can be suppressed effectively by providing the electric field relaxation portion 30.

Although a preferred embodiment of the present invention has been described above, the present invention may also be implemented in yet other modes.

For example, the arrangement at the field plate trench 14 side may be arranged as shown in FIG. 11. FIG. 11 is a sectional view of a semiconductor device 71 according to a modification example. FIG. 11 is a sectional view corresponding to FIG. 4 in the description above. In FIG. 11, arrangements corresponding to arrangements shown in FIG. 4 are provided with the same reference symbols and descriptions thereof shall be omitted.

As shown in FIG. 11, a gap 72 may be formed between each field plate 32 and the body layer 16 plus the source layer 15 thereabove. The gap 72 may have a width approximately equal to the thickness T2 of the thin film portion 25 of the first insulating film 20. The field plate 32 faces a portion of the body layer 16 via the gap 72 and also faces the drain layer 17 and a portion of the body layer 16 via the thin film portion 25 of the first insulating film 20. A bottom portion of the gap 72 is at a middle of the body layer 16 in the depth direction of the field plate trench 14. The bottom portion of the recess portion 46 is constituted of the upper surface of the field plate 32 and the gap 72.

A $p^+$ type body contact layer 73 is formed in the body layer 16 at the inner surface of the field plate trench 14. The body contact layer 73 crosses the gap 72 and the thin film portion 25 of the first insulating film 20 along the side surface of the field plate trench 14. The body contact layer 73 may have an impurity concentration of, for example, not less than $1 \times 10^{20}$ cm$^{-3}$ and not more than $1 \times 10^{22}$ cm$^{-3}$.

A $p^-$ type impurity layer 74 is formed in the drain layer 17 at the inner surface of the field plate trench 14. The impurity layer 74 is electrically connected at its upper portion to the body layer 16 and may be formed across the entire inner surface (side surface and bottom surface) of the field plate trench 14 from the position of connection. By the present arrangement, a body diode 75 is formed by a pn junction of the impurity layer 74 and the drain layer 17 in the semiconductor substrate 2 directly below the field plate trench 14. The body diode 75 in the semiconductor substrate 2 may be arranged instead by a pn junction of the body layer 16 and the drain layer 17. The impurity layer 74 may have an impurity concentration of, for example, not less than $1 \times 10^{19}$ cm$^{-3}$ and not more than $1 \times 10^{21}$ cm$^{-3}$.

The source contact 45 inside the field plate trench 14 enters into the gap 72 and is electrically connected to the body layer 16. The body layer 16 and the source metal 4 can thereby be connected electrically satisfactorily. On the other hand, contact of the source contact 45 and the drain layer 17 is prevented and therefore short-circuiting between the drain layer 17 and the source metal 4 can be prevented. Also, the source contact 45 is tungsten metal, which is better in embedding property than the aluminum metal on the interlayer insulating film 40, and can thus be embedded satisfactorily even in a comparatively narrow space, such as the gap 72. The same effects as the effects described above for the preferred embodiment can be exhibited by such an arrangement as well.

Also, arrangements in which the conductivity types of the respective semiconductor portions of the semiconductor device 1 are inverted may be adopted. That is, in the semiconductor device 1, a p type portion may be of an n type and an n type portion may be of a p type.

Besides the above, various design modifications may be made within the scope of the matters described in the claims.

What is claimed is:

1. A semiconductor device comprising:
   a semiconductor layer having a trench;
   a first insulating film formed along an inner surface of the trench;

an upper electrode and a lower electrode embedded in the trench via the first insulating film and disposed above and below a second insulating film; and an electric field relaxation portion that relaxes an electric field arising between the upper electrode and the semiconductor layer, the electric field relaxation portion being provided between a side surface of the trench and a lower end portion of the upper electrode, wherein the first insulating film includes a thick film portion contacting the lower electrode and a thin film portion having a thickness less than the thickness of the thick film portion and contacting the upper electrode, and wherein the electric field relaxation portion includes an insulating film provided integral to and between the thick film portion and the thin film portion of the first insulating film and having a thickness greater than the thickness of the thin film portion.

2. The semiconductor device according to claim 1, wherein the electric field relaxation portion has a thickness such that a ratio of the thickness of the electric field relaxation portion with respect to the thickness of the thin film portion of the first insulating film is greater than 1 and not more than 4.

3. The semiconductor device according to claim 1, wherein the electric field relaxation portion has a thickness less than the thickness of the thick film portion of the first insulating film.

4. The semiconductor device according to claim 3, wherein the electric field relaxation portion has a thickness such that a ratio of the thickness of the electric field relaxation portion with respect to the thickness of the thick film portion of the first insulating film is not less than 0.5 and less than 1.

5. The semiconductor device according to claim 1, wherein the electric field relaxation portion has a thickness greater than the thickness of the second insulating film.

6. The semiconductor device according to claim 1, wherein the second insulating film has a thickness greater than the thickness of the thin film portion of the first insulating film.

7. The semiconductor device according to claim 1, wherein the electric field relaxation portion includes the same insulating material as the first insulating film.

8. The semiconductor device according to claim 1, further comprising: a source layer, a body layer, and a drain layer formed in that order from a front surface side of the semiconductor layer at a side of the trench; and wherein the electric field relaxation portion is in contact with the drain layer.

9. The semiconductor device according to claim 8, wherein the electric field relaxation portion is formed further to a rear surface side of the semiconductor layer than a boundary portion between the body layer and the drain layer.

10. The semiconductor device according to claim 8, wherein the electric field relaxation portion is formed so as to cross the boundary portion between the body layer and the drain layer.

11. The semiconductor device according to claim 1, wherein an entirety of the upper electrode is positioned higher than an upper end portion of the lower electrode across the second insulating film.

12. The semiconductor device according to claim 1, wherein a projecting portion, provided along the side surface of the trench and projecting toward the lower electrode side, is formed at the lower end portion of the upper electrode, and the electric field relaxation portion is in contact with the projecting portion of the upper electrode.

13. The semiconductor device according to claim 12, wherein an entirety of the projecting portion of the upper electrode is positioned higher than the upper end portion of the lower electrode across the second insulating film.

14. The semiconductor device according to claim 1, wherein a plurality of the trenches, including a gate trench, are formed in the semiconductor layer, and the upper electrode embedded in the gate trench serves in common as a gate electrode.

15. The semiconductor device according to claim 1, wherein a plurality of the trenches, including a field plate trench, are formed in the semiconductor layer, and the upper electrode embedded in the field plate trench serves in common as a field plate.

16. The semiconductor device according to claim 15, wherein the upper electrode and the lower electrode include polysilicon.

17. The semiconductor device according to claim 15, wherein the first insulating film includes silicon oxide.

* * * * *

UNITED STATES PATENT AND TRADEMARK OFFICE
CERTIFICATE OF CORRECTION

PATENT NO. : 9,716,152 B2
APPLICATION NO. : 15/245172
DATED : July 25, 2017
INVENTOR(S) : Masaki Nagata et al.

Page 1 of 1

It is certified that error appears in the above-identified patent and that said Letters Patent is hereby corrected as shown below:

In the Claims

Column 16, (Line 39) In Claim 16, Line 1 before "wherein" change "15" to --1--.
Column 16, (Line 42) In Claim 17, Line 1 before "wherein" change "15" to --1--.

Signed and Sealed this
Twenty-fourth Day of October, 2017

Joseph Matal
*Performing the Functions and Duties of the
Under Secretary of Commerce for Intellectual Property and
Director of the United States Patent and Trademark Office*